United States Patent
Otani et al.

(10) Patent No.: US 7,287,115 B2
(45) Date of Patent: Oct. 23, 2007

(54) MULTI-CHIP PACKAGE TYPE MEMORY SYSTEM

(75) Inventors: Takayuki Otani, Hachioji (JP); Takashi Suzuki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 503 days.

(21) Appl. No.: 10/968,970

(22) Filed: Oct. 21, 2004

(65) Prior Publication Data
US 2005/0114613 A1 May 26, 2005

(30) Foreign Application Priority Data
Oct. 30, 2003 (JP) .............................. 2003-371006
Dec. 26, 2003 (JP) .............................. 2003-432786

(51) Int. Cl.
*G06F 12/00* (2006.01)
(52) U.S. Cl. ................................ 711/5; 711/5; 711/100; 711/101; 711/102; 711/103; 711/104; 711/105; 711/219; 365/230.01; 365/230.03; 365/230.08; 713/1; 713/2; 713/100
(58) Field of Classification Search ................. 711/100, 711/102–103
See application file for complete search history.

(56) References Cited

U.S. PATENT DOCUMENTS 6,456,517 B2 * 9/2002 Kim et al. ..................... 365/51
6,721,840 B1 * 4/2004 Allegrucci .................. 710/306
2002/0118593 A1 * 8/2002 Takemae ..................... 365/233
2003/0156473 A1 * 8/2003 Sinclair et al. ............. 365/200

FOREIGN PATENT DOCUMENTS

| JP | 5-299616 | 11/1993 |
|----|----------|---------|
| JP | 6-4410 | 1/1994 |
| JP | 11-353229 | 12/1999 |
| JP | 2001-243173 | 9/2001 |

* cited by examiner

*Primary Examiner*—Sanjiv Shah
*Assistant Examiner*—Zhuo H. Li
(74) *Attorney, Agent, or Firm*—Oblon, Spivak, McClelland, Maier & Neustadt, P.C.

(57) ABSTRACT

A multichip package type memory system is disclosed, which comprises a plurality of types of memory integrated circuits which are provided in a memory system in a package having an internal bus, and accessed from exterior of the package and/or within the package, and a controlling integrated circuit which is provided in the memory system in the package, and when an instruction of data transfer within the memory system is received from exterior of the package, controls an execution of the data transfer to be executed within the memory system such that data of memory cells at addresses of a first memory integrated circuit are read out, and the readout data are written into memory cells at addresses of a second memory integrated circuit.

12 Claims, 13 Drawing Sheets

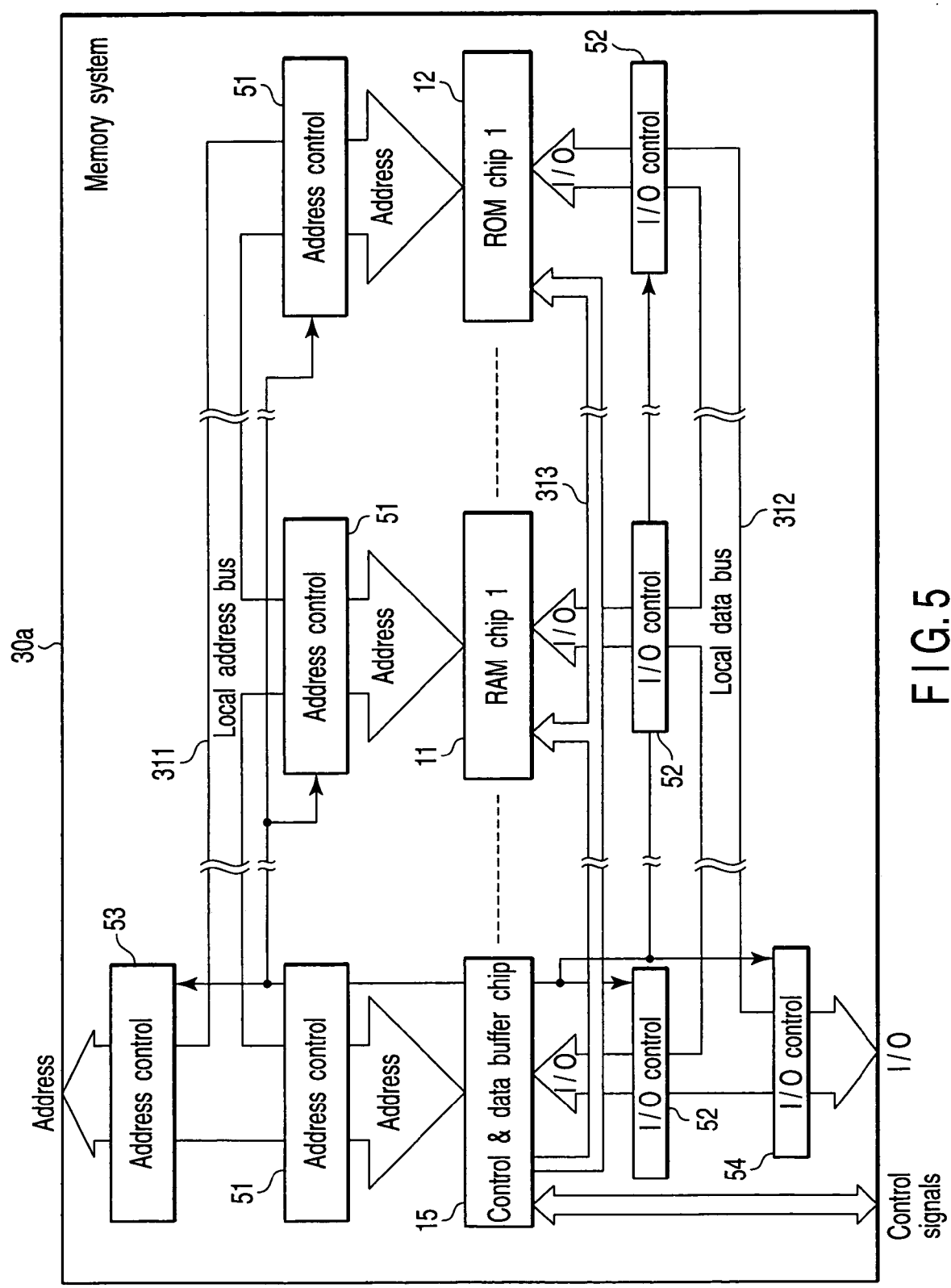
F I G. 5

MULTI-CHIP PACKAGE TYPE MEMORY SYSTEM

CROSS-REFERENCE TO RELATED APPLICATIONS

This application is based upon and claims the benefit of priority from prior Japanese Patent Applications No. 2003-371006, filed Oct. 30, 2003; and No. 2003-432786, filed Dec. 26, 2003, the entire contents of both of which are incorporated herein by reference.

BACKGROUND OF THE INVENTION

1. Field of the Invention

The present invention relates to a memory system used for a computer system, and in particular, to a multichip package (Multi-Chip-Package; MCP) type memory system, and is applied to, for example, the field required for miniaturization of memories in a portable device.

2. Description of the Related Art

Generally, a memory integrated circuit (memory LSI) and an input/output (I/O) device which are connected to a computer system are accessed under the control of a central processor unit (CPU) of the system. However, if the CPU carries out transmitting and receiving data via a system bus while carrying out the entire management of the system bus, a load on the CPU is increased. Then, conventionally, a DMA (Direct Memory Access) mode is used, and data transfer between memory LSIs, or between a memory LSI and an input/output device is efficiently carried out, and the load on a CPU is reduced.

FIGS. 15 and 16 show a system configuration and operations when data transfer is carried out between two memory LSIs by using a DMA mode in a conventional computer system.

When DMA transfer is carried out, a system bus 90 is controlled by, not a CPU (not shown), but a DMA controller 91. On the basis of instructions (a chip select signal /CS, a read enable signal /RE, a write enable signal /WE, address data (Ao to Ai) on an address bus (Address Bus)) from the DMA controller 91, data is read on a data bus (Do to Dj) on the system bus 90 from a transfer origin memory in a memory system 100, the data is temporarily stored in a data buffer in the DMA controller 91, and thereafter, the data is written into a transfer destination memory in the memory system 100. In the meantime, because the CPU is free from a job of data transfer, and can carry out another job, the processing efficiency of the CPU as the entire system can be improved.

However, in execution of DMA transfer, because data read/write operations are carried out via the system bus 90, the system bus 90 is occupied by the data read/write operations during a period of time of the number of cycles corresponding to the number of items of data to be transferred, and the efficiency of the entire system is reduced.

As described above, the conventional computer system has the problem that the efficiency of the entire system is reduced because the system bus 90 is occupied by data read/write operations during a period of time of the number of cycles corresponding to the number of items of data to be transferred.

Note that, in a data processing apparatus in Jpn. Pat. Appln. KOKAI Publication No. 2001-243173, there is disclosed the point that a DMA controller controlling high-speed transfer between two RAMs is provided.

FIG. 17 shows a configuration example of another conventional computer system. Reference numeral 101 denotes a CPU, reference numeral 90 denotes a system bus formed from an address bus, a data bus, and a control signal bus, reference numeral 92 denotes a memory integrated circuit (LSI) such as, for example, a dynamic memory (Dynamic Random Access Memory; DRAM), and reference numeral 100A denotes a memory system.

The memory system 100A has, for example, a NOR type flash memory 93, a static type memory (Static Random Access Memory; SRAM) 94, and a NAND type flash memory 95. A system starting program including a control program needed at the time of system starting is usually stored in the NOR type flash memory 93, and the CPU 101 reads and executes the system starting program at the time of system starting.

The reason for that the system starting program is stored in the NOR type flash memory 93 is that, because a random access read rate in the NOR type flash memory 93 is about 60 ns to 70 ns which is relatively high, even if a program code is executed while being directly read out of the NOR type flash memory 93, the speed performance of the entire computer system is unaffected.

On the other hand, in the NAND type flash memory 95, as compared with the NOR type flash memory 93, a random access read rate is slower, and write/erase operations and serial read operation are faster. Moreover, because a memory cell area is small, an even lower-priced bit cost can be realized. An application of the NAND type flash memory 95 is suitable for recording a file such as an image or audio data which is frequently updated to some extent, and of which reading is serially carried out.

In consideration of such a characteristic of the flash memory, in recent years, in a system for a portable telephone, or the like, a NOR type flash memory is used for recording a program, and a NAND type flash memory is used for recording a file such as an image or audio data. In the future, it is anticipated that, when a bit capacity in an application for recording a file such as an image or audio data is increased for the entire system, a flash memory for recording a file will become dominant among nonvolatile memories in terms of capacity.

On the basis of the above background, a request that a memory packaging area is made smaller by using only a NAND type flash memory suitable for recording a file as a flash memory for use in a computer system, and moreover, the bit cost of the entire system is reduced has been made stronger from the system side.

On the other hand, a memory system used for a computer system such as a portable terminal or the like of which miniaturization of a device is strongly required has been required to be miniaturized, and in recent years, a multichip package (Multi Chip Package; MCP) type memory system in which a plurality of memory LSI chips are accommodated in a single package has started to be used. In such an MCP type memory system, it is expected that processing of a system starting program is appropriately carried out, and that an attempt is made to ensure adequate file recording capacity and reduction in bit cost.

As described above, the memory system used for the conventional computer system has the problem that, if a NOR type flash memory for storing a system starting program and another flash memory for recording a file are respectively used, a memory packaging area is increased, and the bit cost of the entire system rises.

Note that there is disclosed a technique of packaging a flash memory and a RAM into one package in Jpn. Pat.

Appln. KOKAI Publication No. 5-299616. Further, in Jpn. Pat. Appln. KOKAI Publication No. 6-4410, there is disclosed a technique in which an EEPROM and a RAM having a capacity which is the same as that of the EEPROM are provided, data of the EEPROM is transferred to the RAM, usual reading and writing data are carried out with respect to the RAM, and the data is written into the EEPROM only when the data in the RAM is changed. Further, in Jpn. Pat. Appln. KOKAI Publication No. 11-353229, there is disclosed a technique in which a program stored in a flash memory is read out and written into a RAM at the time of system starting.

BRIEF SUMMARY OF THE INVENTION

According to an aspect of the present invention, there is provided a multichip package type memory system comprising:

a plurality of types of memory integrated circuits each having memory cells, which are provided in a memory system packaged in a package having an internal bus including a local data bus, a local address bus, and a local control bus, and are connected to the internal bus in common, and which are accessed for a predetermined operation among read, write, and erase operations from exterior of the package, and/or, which are accessed for a predetermined operation among read, write, and erase operations within the package; and a controlling integrated circuit which is provided in the memory system packaged in the package, and when an instruction of data transfer within the memory system is received from exterior of the package, controls an execution of the data transfer to be executed within the memory system such that data of memory cells at continuous addresses of a first readable memory integrated circuit among the plurality of types of memory integrated circuits from a start address up to an end address of the first readable memory integrated circuit are read out, and the readout data are written into memory cells at continuous addresses of a second writable memory integrated circuit among the plurality of types of memory integrated circuits from a start address up to an end address of the second writable memory integrated circuit.

According to another aspect of the present invention, there is provided a computer system comprising:

a multichip package type memory system which comprises a plurality of types of memory integrated circuits each having memory cells, which are provided in a memory system packaged in a package having an internal bus including a local data bus, a local address bus, and a local control bus, and are connected to the internal bus in common, and which are accessed for a predetermined operation among read, write, and erase operations from exterior of the package, and/or, which are accessed for a predetermined operation among read, write, and erase operations within the package; and a controlling integrated circuit which is provided in the memory system packaged in the package, and when an instruction of data transfer within the memory system is received from exterior of the package, controls an execution of the data transfer to be executed within the memory system such that data of memory cells at continuous addresses of a first readable memory integrated circuit among the plurality of types of memory integrated circuits from a start address up to an end address of the first readable memory integrated circuit are read out, and the readout data are written into memory cells at continuous addresses of a second writable memory integrated circuit among the plurality of types of memory integrated circuits from a start address up to an end address of the second writable memory integrated circuit;

a system bus connected to the multichip package type memory system; and a central processing unit configured to provide the instruction of data transfer within the memory system to the controlling integrated circuit of the multichip package type memory system via the system bus.

According to a further aspect of the present invention, there is provided a multichip package type memory system comprising:

a nonvolatile memory integrated circuit and a volatile memory integrated circuit which are packaged in a package, the nonvolatile memory integrated circuit including an electrically erasable/rewritable flash memory other than a NOR type flash memory and configured to store a system starting program, and the volatile memory integrated circuit having a random access operation speed higher than the nonvolatile memory integrated circuit;

an internal bus which is formed in the package, and which includes an address bus and a data bus connected to the nonvolatile memory integrated circuit and the volatile memory integrated circuit in common; and a control circuit unit which controls a data transfer such that the system starting program is read out of the nonvolatile memory integrated circuit at the time of system starting and the readout data is transferred to and written in the volatile memory integrated circuit via the data bus.

According to a further aspect of the present invention, there is provided a computer system comprising:

a multichip package type memory system which comprises a nonvolatile memory integrated circuit and a volatile memory integrated circuit which are packaged in a package having an internal bus including an address bus and a data bus, in which the nonvolatile memory integrated circuit includes an electrically erasable/rewritable flash memory other than a NOR type flash memory and configures to store a starting program, and the volatile memory integrated circuit has a random access operation speed higher than the nonvolatile memory integrated circuit; and a control circuit unit which is built in the nonvolatile memory integrated circuit or the volatile memory integrated circuit and controls a data transfer such that the starting program is read out of the nonvolatile memory integrated circuit at the time of system starting and the readout data is transferred to and written in the volatile memory integrated circuit via the data bus;

a system bus connected to the multichip package type memory system; and a central processing unit connected to the controlling integrated circuit of the multichip package type memory system as an external memory via the system bus, and controls a data transfer such that the starting program which has been written in the volatile memory integrated circuit by the control circuit unit.

According to a further aspect of the present invention, there is provided a computer system comprising:

a multichip package type memory system which comprises a nonvolatile memory integrated circuit and a volatile memory integrated circuit which are packaged in a package having an internal bus including an address bus and a data bus, in which the nonvolatile memory integrated circuit includes an electrically erasable/rewritable flash memory other than a NOR type flash memory and configures to store a starting program, and the volatile memory integrated circuit has a random access operation speed higher than the nonvolatile memory integrated circuit; and a control circuit unit built in an integrated circuit which is other than the nonvolatile memory integrated circuit and the volatile memory integrated circuit and which is packaged in the package and connected to the internal bus;

a system bus connected to the multichip package type memory system; and a central processing unit connected to the controlling integrated circuit of the multichip package type memory system as an external memory via the system bus, and controls a data transfer such that the starting program which has been written in the volatile memory integrated circuit by the control circuit unit.

BRIEF DESCRIPTION OF THE SEVERAL VIEWS OF THE DRAWING

FIG. 5 is a block diagram showing a first concrete example relating to signal pin specifications of the memory system according to the first embodiment of the present invention.

DETAILED DESCRIPTION OF THE INVENTION

First Embodiment

Figure 1:
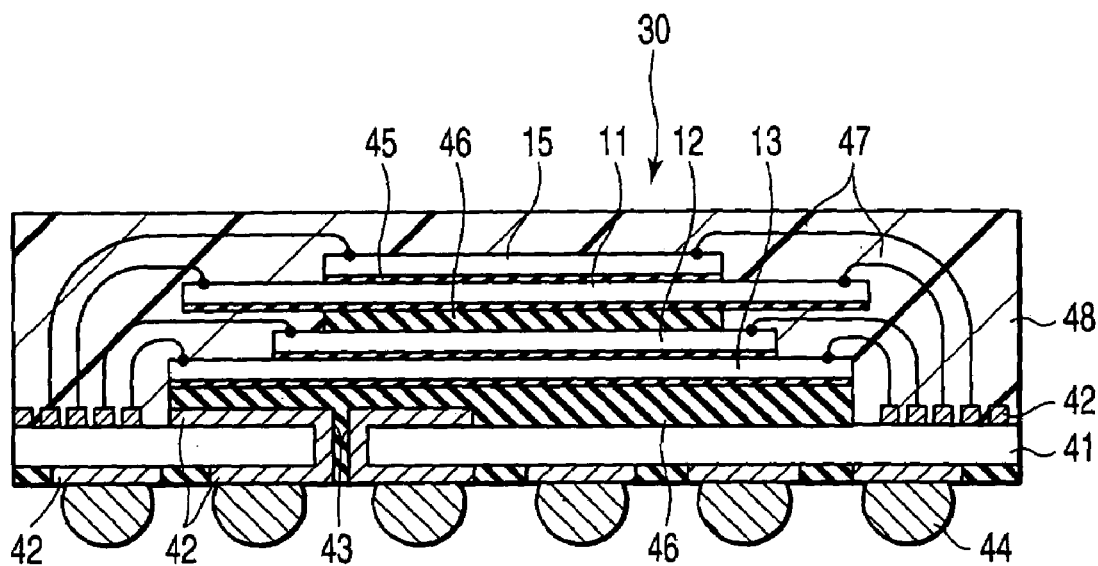
FIG. 1 is a sectional view schematically showing a packaging example of a multichip package type memory system according to a first embodiment of the present invention.
Figure 2:
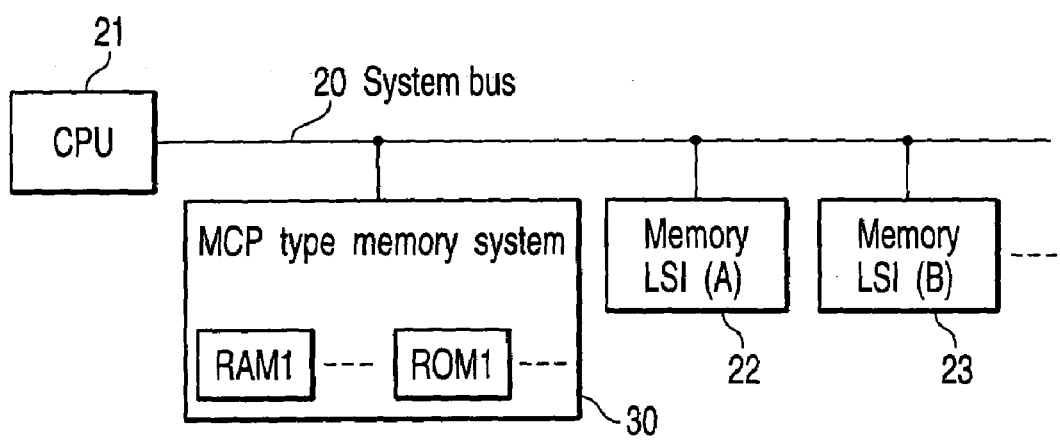
FIG. 2 is a diagram showing a typical configuration of a computer system to which the memory system shown in FIG. 1 is connected as a part of an external memory.
Figure 3:
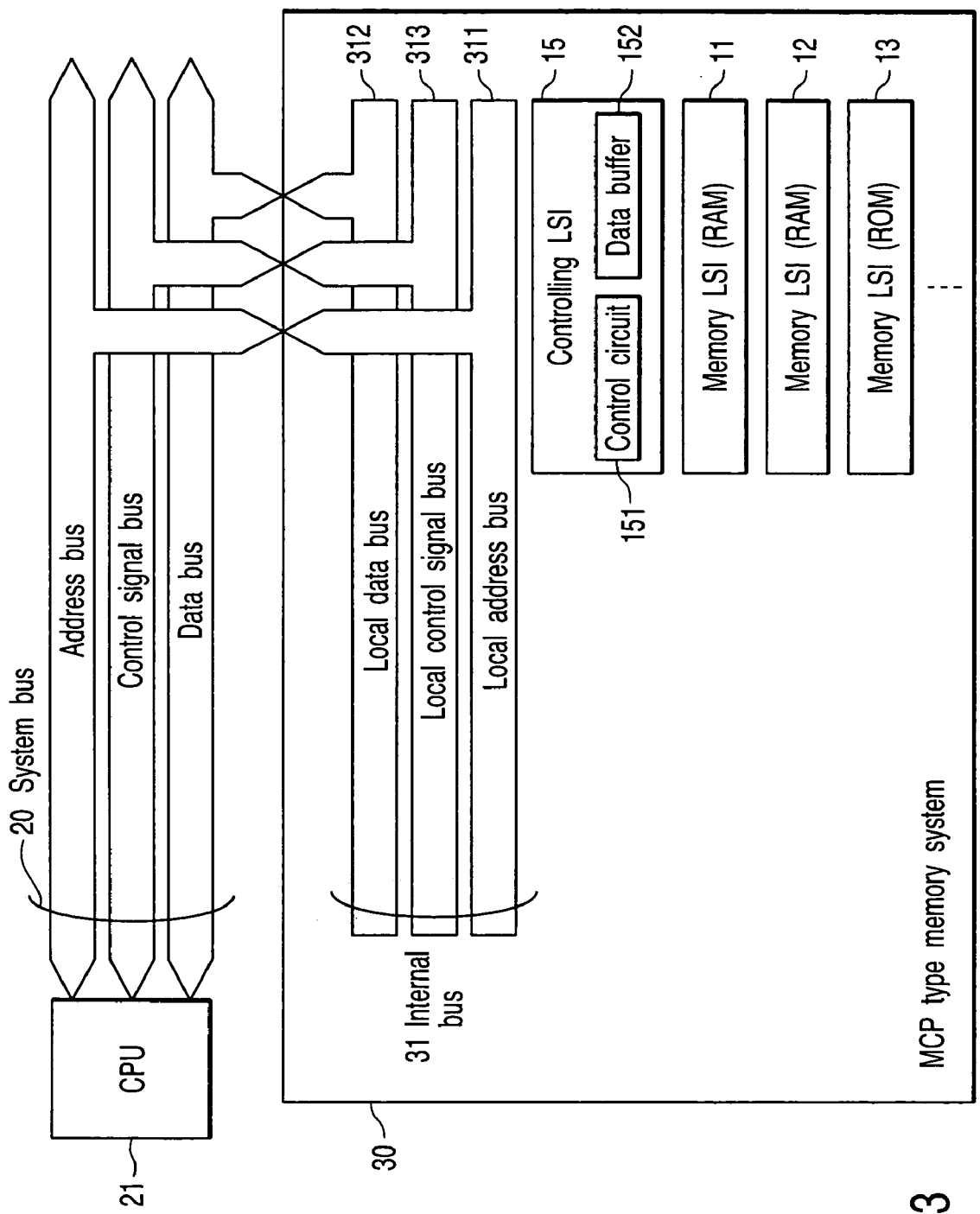
FIG. 3 is a block diagram schematically showing the configuration of the computer system of FIG. 2.

FIG. 1 is a sectional view schematically showing a packaging example of an MCP type memory system 30 according to a first embodiment of the present invention. FIG. 2 is a diagram showing a typical configuration of a computer system to which the MCP type memory system 30 shown in FIG. 1 is connected as an external memory. FIG. 3 is a block diagram schematically showing the configuration of the computer system shown in FIG. 2.

In FIG. 1, at a packaging substrate 41, wiring patterns 42 are respectively formed on the top surface and the rear surface thereof, and some of those are connected via a through hole wiring 43. External connection terminals (for example, a ball grid array) 44 are formed on the rear surface of the packaging substrate 41. In the present embodiment, the aforementioned internal bus 31 (FIG. 3) including a local address bus 311, a local data bus 312, and a local control bus 313 is formed as a part of the wiring patterns 42. A plurality of LSI chips (hereinafter, abbreviated to LSI) are stacked on the packaging substrate 41 via an adhesive 45 and a spacer 46. In the embodiment, plural types of memory LSI 11, LSI 12, and LSI 13, and a controlling LSI 15 are included in the plurality of LSIs. The memory LSI 11, LSI 12, and LSI 13, and the controlling LSI 15 are connected to the wiring patterns 42 on the top surface of the packaging substrate via respective pads by bonding wires 47, and are sealed with a resin 48. In accordance with the configuration, the multichip package type memory system 30 with a stack structure which is small-sized and thin as a whole (Stacked MCP) is configured.

Note that, in the present embodiment, the plural types of memory LSI 11, LSI 12, and LSI 13 include a static memory (Static Random Access Memory: SRAM), a pseudo SRAM (Pseudo SRAM: PSRAM), a NOR flash memory and a NAND flash memory which can be collectively erased, and a NAND flash memory with a controller. In addition, a dynamic memory (Dynamic Random Access Memory: DRAM), a low-power synchronous type dynamic memory (Synchronous DRAM: SDRAM), and a read only memory (Read Only Memory: ROM) may be included.

In a computer system shown in FIGS. 2 and 3, a CPU 21, general memory LSI(A) 22, LSI(B) 23 (not shown in FIG. 3), the MCP type memory system 30 shown in FIG. 1 and the others (not shown) are connected to a system bus 20. The above-described system bus 20 includes a data bus, an address bus, and a control signal bus.

The MCP type memory system 30 has the local address bus 311, the local data bus 312, and the local control signal bus 313, as the internal bus 31 connected to the system bus 20. The plural types of memory LSI 11, LSI 12, LSI 13, and the controlling LSI 15 having a predetermined control function are connected to these internal buses.

By accessing from the exterior of the package or the controlling LSI 15 with respect to a memory LSI among the plural types of memory LSI 11, LSI 12, and LSI 13 in the MCP type memory system 30, a predetermined operation among the read, write, and erase operations is possible. In this case, it is possible to access from the exterior of the package or the controlling LSI 15 via an interface specification which the plural types of memory LSI 11, LSI 12, or LSI 13 has. Here, an access to a SRAM or a PSRAM is carried out at the time of read/write, and an access to a NOR flash memory or a NAND flash memory is carried out at the time of read/write/erase.

The controlling LSI 15 includes a control circuit 151 and a data buffer 152, and is connected to a control signal bus of the system bus 20 outside the memory system. The controlling LSI 15 has a function of controlling an access to each of the memory LSI 11, LSI 12, and LSI 13 in the memory system 30 and an operation data transfer between two memory LSIs. For example, when an instruction of data transfer between two memory LSIs in the memory system is received from the outside of the package, the controlling LSI 15 controls the transfer operation to be executed. This function is a function of controlling such that, when an instruction of data transfer in the memory system is received from the exterior of the package, a data transfer operation in which the data of the memory cells at continuous addresses from a start address up to an end address of a first readable (i.e., read-accessible) memory LSI among the aforementioned plural types of memory LSI 11, LSI 12, and LSI 13 are read out via an interface specification which the first readable memory LSI has, and the read data are written into the memory cells at continuous addresses from a start address up to an end address of a second writable (i.e., write-accessible) memory LSI via an interface specification which the second writable memory LSI has, is executed inside the memory system.

In other words, the above-described data transfer execution control function is a function of controlling such that an operation of data transfer between memory LSIs in the memory system is executed regardless of what types the readable transfer origin memory and a writable transfer destination memory are, on the basis of designation by an instruction of data transfer between memory LSIs in the memory system with regard to a transfer origin memory, a read start address of the transfer origin memory, a read end address of the transfer origin memory, a transfer destination memory, a write start address of the transfer destination memory, and a write end address of the transfer destination memory.

Note that, in the computer system shown in FIGS. 2 and 3, when the CPU 21 provides an instruction of data transfer between memory LSIs in the memory system with respect to the controlling LSI 15 of the MCP type memory system 30, the control by the CPU 21 and the DMA controller (not shown) is different from the conventional DMA control in which data transfer between memory LSIs is carried out (data transfer between memory LSIs outside the memory system).

Figure 4:
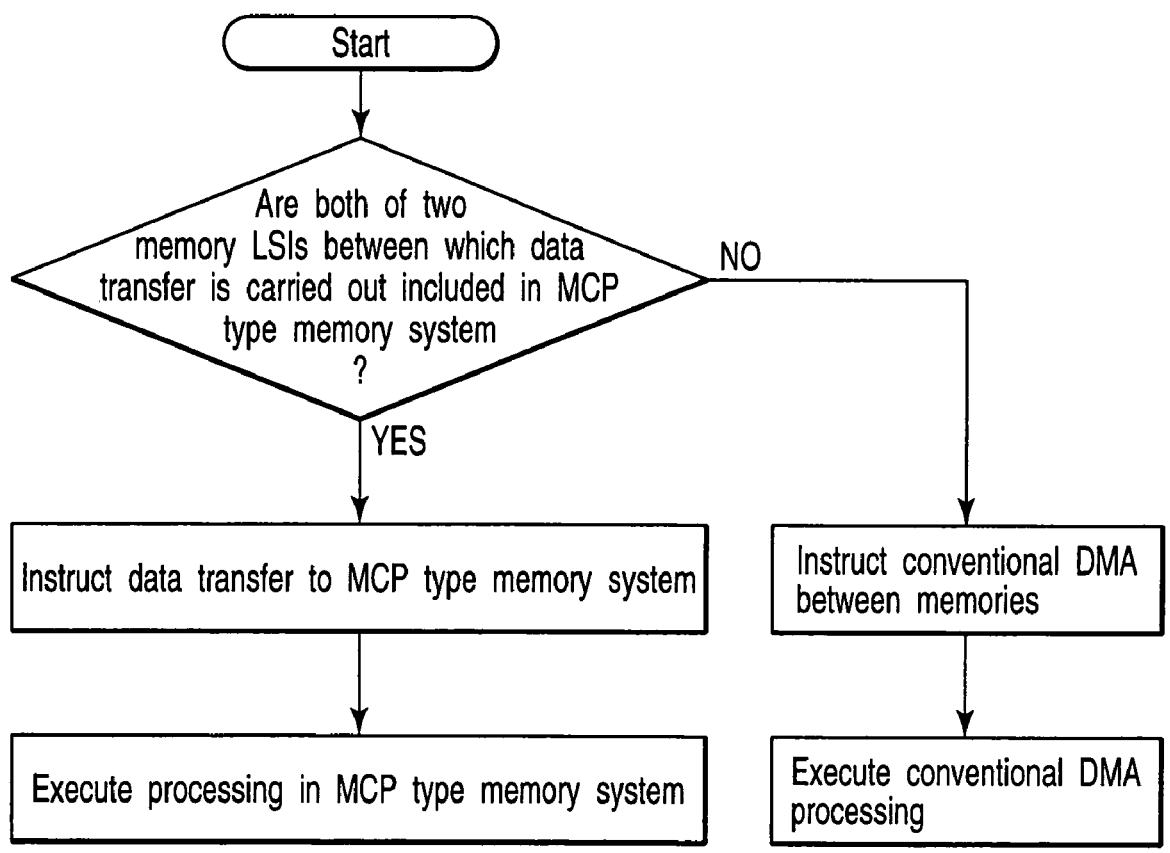
FIG. 4 is a flowchart showing control in a case of executing data transfer between memory LSIs in the computer system shown in FIG. 3.

Namely, in the computer system shown in FIG. 3, as the control in a case of executing data transfer between memory LSIs, for example, in accordance with a flowchart shown in FIG. 4, it is possible to respectively use the DMA control so that data transfer between separate LSIs is carried out in the same way as in the prior art, or the control of data transfer between memory LSIs inside the memory system.

In this case, (1) when two memory LSIs which will be objects for data transfer are included in the MCP type memory system 30, an instruction of data transfer between memory LSIs in the memory system which is for executing data transfer between memory LSIs in the memory system 30 is provided to the controlling LSI 15. Concretely, a transfer origin memory, a read start address of the transfer origin memory, a read end address of the transfer origin memory, a transfer destination memory, a write start address of the transfer destination memory, and a write end address of the transfer destination memory are designated by an instruction of data transfer between memory LSIs in the memory system. In accordance therewith, an operation of data transfer between memory LSIs inside the memory system 30 is executed regardless of what types a random read transfer origin memory and a random write transfer destination memory are, under the standard control common to the memory system including a timing specification or the like.

(2) When only one of the two memory LSIs which will be objects for data transfer is included in the MCP type memory system 30, data transfer between LSIs as in the conventional DMA control (data transfer between memory LSIs outside the memory system) is executed. Namely, regardless of whether the memory LSI 11, LSI 12, and LSI 13 included in the MCP type memory system 30 are a transfer origin memory or a transfer destination memory, the memory LSIs are accessed as separate memory LSIs under the control of the DMA controller, and an operation of data transfer between memory LSIs is executed.

As described above, because the MCP type memory system 30 according to the present embodiment has a configuration in which the plural types of memory LSI 11, LSI 12, and LSI 13 and the controlling LSI 15 having a predetermined function are connected in common to the internal bus 31, operations as enumerated hereinafter are possible due to the MCP type memory system 30 being connected as an external memory of the computer system.

(a) It is possible to directly access the memory LSI 11, LSI 12, and LSI 13 in the memory system 30 in the same way as in a case of directly accessing the separate memory LSI(A), LSI(B) 22.

(b) When data transfer between memory LSIs included in the MCP type memory system 30 is carried out, information needed for operations of transferring a transfer origin memory, and a transfer start address and a transfer end address of the transfer origin memory, a transfer destination memory, a transfer start address and a transfer end address of the transfer destination memory, etc. can be used as common interfaces which do not depend on the types of the memory LSI 11, LSI 12, and LSI 13 from the computer system side.

(c) After predetermined information are received from the computer system side, all of the operations are controlled by the control circuit 151 in the memory system 30, and operations such as controlling read-out of the transfer origin memory, and write-into the transfer destination memory are executed by using the internal bus 31 of the memory system 30.

Because the system bus 20 of the computer system is not occupied in execution of data transfer between the memory LSIs, a load on the CPU 21 can be reduced, and moreover, because the CPU 21 can execute another job by using the system bus 20 even in execution of data transfer, the performance of the entire system can be greatly improved.

Note that, as will be described later, when interfaces for accessing the separate memory LSI 11, LSI 12, and LSI 13 in the memory system 30 are made to be common to the memory system 30, because it is possible to access any of the memory LSI 11, LSI 12, and LSI 13 not via the interfaces which the separate memory LSI 11, LSI 12, and LSI 13 respectively have, but via the common interface, the control at the computer system side can be simplified.

Namely, in a present standard NAND flash memory, address information, write data information, and read data information are inputted and outputted in a time-sharing manner by using an I/O pin of 8 bits as an external interface. Further, generally, because parity bit information is included in the outputted read data, the read information cannot be obtained if the outputted read data is as is, and the read information can be obtained after ECC (error checking and correction) processing is applied thereto. Then, in a general NAND flash memory system, an input/output controlling LSI (not shown) dedicated for the processings including ECC processing and other processings is used. Due to such an input/output controlling LSI being included in the controlling LSI 15 in the MCP type memory system 30 according to the present embodiment, the NAND flash memory can be operated by a common and standard interface from the exterior of the package.

<First Concrete Example Relating to Signal Pin Specification of Memory System in First Embodiment>

FIG. 5 is a block diagram showing a first concrete example relating to an MCP type memory system, and in particular, to a signal pin specification thereof, according to the first embodiment. In this MCP type memory system 30a, a RAM chip 1 and a ROM chip 1 are shown as the plural types of memory LSI 11 and LSI 12, and a control & data buffer chip is shown as the controlling LSI 15.

In order to make the control by the controlling LSI 15 as described above possible, first address bus gates (Address Control) 51 are respectively inserted between the local address bus 311 and the address inputs of the respective memory LSI 11 and LSI 12. Further, first data bus gates (I/O control) 52 are respectively inserted between the local data bus 312 and the data inputs/outputs of the respective memory LSI 11 and LSI 12. Moreover, a second address bus gate (Address Control) 53 is inserted between the local address bus 311 and the external address bus (Address), and a second data bus gate (I/O control) 54 is inserted between the local data bus 312 and the external data bus. The above-described respective address bus gates 51 and 53 and the respective data bus gates 52 and 54 are controlled to be turned on and off by control signals generated at the control circuit in the controlling LSI 15. The local control signal bus 313 is connected to an external control signal bus (Control Signals) via the controlling LSI 15 without being via the bus gates.

Namely, in the MCP type memory system 30a shown in FIG. 5, as the basic configuration thereof, the respective memory LSI 11 and LSI 12 are connected to each other by the local address bus 311, the local data bus 312, and the local control signal bus 313. Then, the first address bus gates 51 are inserted in the address bus branched paths branched off from the local address bus 311 so as to correspond to the respective memory LSI 11 and LSI 12. The second address bus gate 53 is inserted between the local address bus 311 and the external address bus. Further, the first data bus gates 52 are inserted in the data bus branched paths branched off from the local data bus 312 so as to correspond to the respective memory LSI 11 and LSI 12. In addition, the second data bus gate 54 is inserted between the local data bus 312 and the external address bus.

Second Embodiment

In the first embodiment described above, there has been described the example in which read, write, and erase access operations are carried out via the interface specifications (I/O data signal pin, address signal pin, and control signal pin and control method) which the respective memory LSI 11, LSI 12, and LSI 13 in the MCP type memory system 30 have.

However, from the standpoint of the computer system, rather than a case of accessing via the interface specifications which the respective memory LSI 11, LSI 12, and LSI 13 in the MCP type memory system respectively have, if it is possible to access via the common I/O data signal pin, address signal pin, and control signal pin which the memory system has, it is easier to construct the system. In this case, necessarily, the controlling LSI 15 in the memory system needs a control function of converting an instruction received from the exterior of the memory system into the interface specifications of the respective memory LSI 11, LSI 12, and LSI 13 in the memory system 30, and of accessing thereto and obtaining it, in accordance with the types of the respective memory LSI 11, LSI 12, and LSI 13.

The MCP type memory system according to the second embodiment has a configuration which is basically the same as the MCP type memory system shown in FIGS. 1 to 3. However, the controlling LSI 15 has a function of accessing via standard interface specifications common to the memory system with respect to a memory LSI among the plural types of memory LSI 11, LSI 12, and LSI 13, and of carrying out a predetermined operation among the read, write, and erase operations.

In accordance with this function, an operation of data transfer between memory LSIs can be executed within the memory system via the interface specification common to the memory system including a timing specification or the like. Namely, the controlling LSI 15 receives an instruction of data transfer between memory LSIs in the memory system from the exterior of the package, whereby data of the memory cells at the continuous addresses from a start address up to an end address of a first readable memory LSI among the plural types of memory LSI 11, LSI 12, and LSI 13 can be read out, and the read data can be written into the memory cells at the continuous addresses from a start address up to an end address of a second writable memory LSI. In other words, in addition to the instruction of data transfer between memory LSIs in the memory system, a transfer origin memory, a read start address of the transfer origin memory, a read end address of the transfer origin memory, a transfer destination memory, a write start address of the transfer destination memory, and a write end address of the transfer destination memory are designated, whereby an operation of data transfer between memory LSIs in the memory system is executed regardless of what types a readable transfer origin memory and a writable transfer destination memory are.

Third Embodiment

In the second embodiment described above, the example in which, at the time of accessing a memory LSI in the memory system is carried out, the access is carried out via a common standard interface has been described.

However, in actual existing applications, the computer system side prepares interfaces for various ROMs and RAMs, so that the system can be directly connected to the various ROMs and RAMs.

In a third embodiment of the present invention, a system is configured so as to be able to correspond to any of the first embodiment and the second embodiment described above, and in accordance therewith, it is possible to provide a memory system which is more flexible and easier to use during a period of transition of configuring the system.

Namely, in the third embodiment, a controlling LSI has a first function of carrying out an access operation with respect to a memory LSI among the plural types memory LSI 11, LSI 12, and LSI 13 in the MCP type memory system via an interface specification which the memory has, and a second function of carrying out an access operation with respect to a memory LSI among the plural types memory LSI 11, LSI 12, and LSI 13 via an interface specification common to the memory system 30, and of carrying out a predetermined operation among the read, write, and erase operations. In accordance therewith, it is possible to access from the exterior of the package or the controlling LSI 15 to the memory LSI 11, LSI 12, and LSI 13 in the MCP type memory system via the interfaces which the memory LSI 11, LSI 12, and LSI 13 have, and to carry out a predetermined operation among the read, write, and erase operations. Further, it is possible to access the memory LSI 11, LSI 12, and LSI 13 in the MCP type memory system via the interface common to the memory system, and to carry out a predetermined operation among the read, write, and erase operations.

<Another Concrete Example Relating to Signal Pin Specification in First to Third Embodiments>

FIG. 5 shows the first concrete example relating to a signal pin specification between the MCP type memory system and the exterior of the MCP type memory system, in particular, relating to the specifications of the I/O data signal pin and the address signal pin, and because the interfaces are taken via the I/O and address signal pins common to all the memory LSIs in the memory system 30a, there are advantages in the areas of simplifying the system, reducing the number of pins, and the like.

However, the interface specifications of the various memory LSIs are not unified in the present circumstances. Because particular specifications are respectively set to the various memory LSIs, a case where it is difficult to carry out signal input/output via the standard I/O data signal pin and address signal pin common to all the memory LSIs in the memory system 30a is possible.

Figure 6:
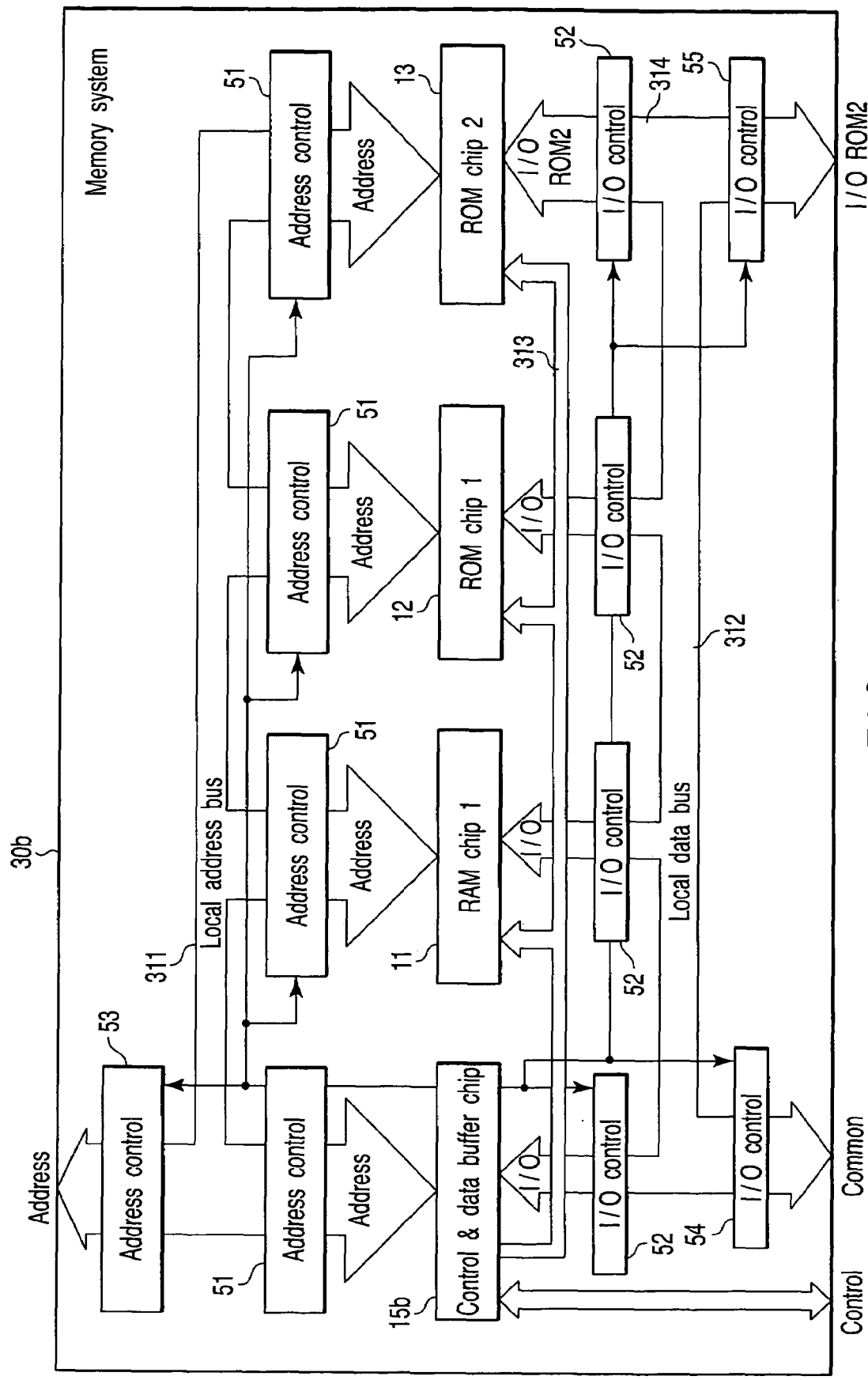
FIG. 6 is a block diagram showing a second concrete example relating to signal pin specifications of the memory system according to the first embodiment of the present invention.
Figure 7:
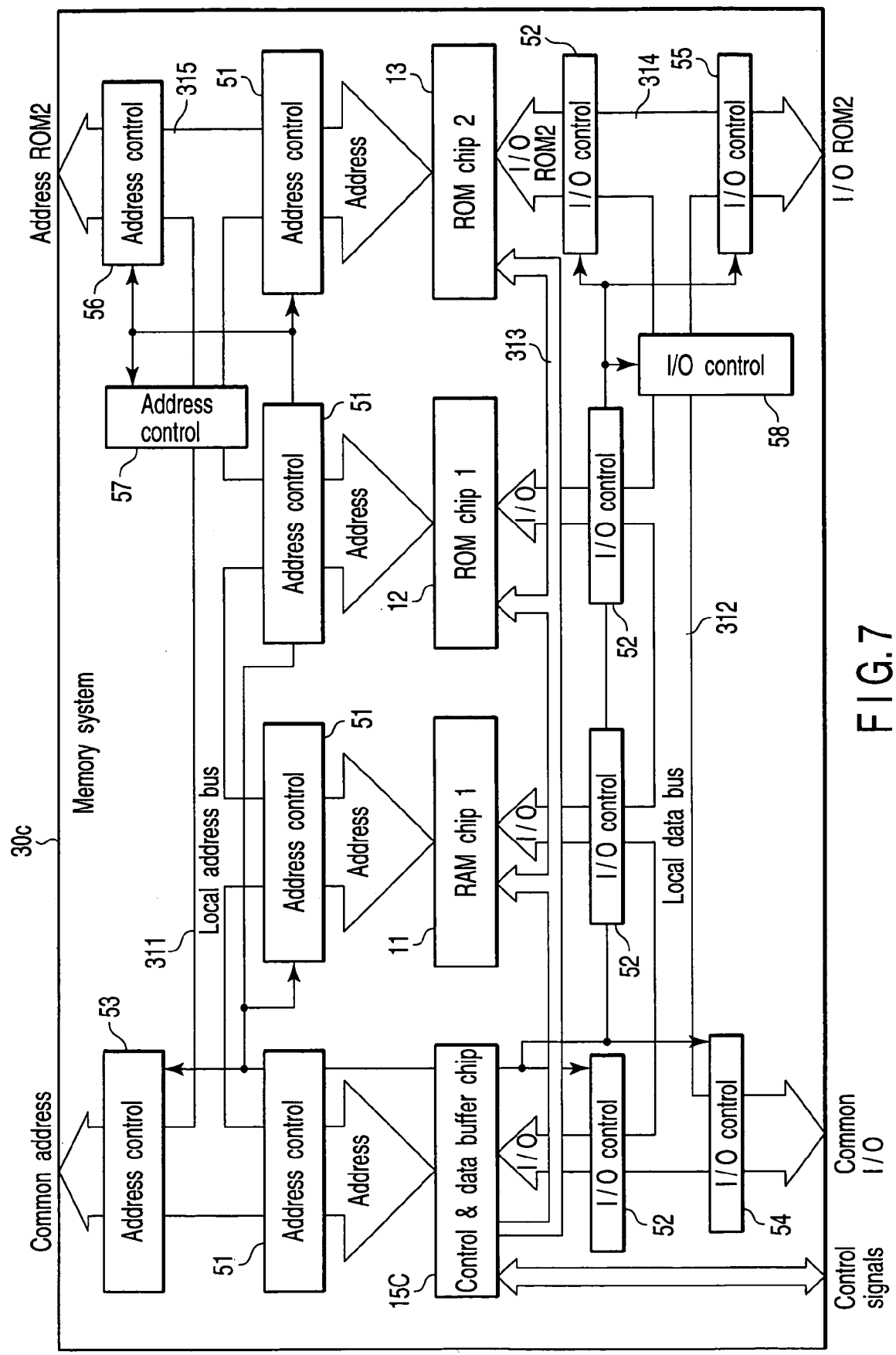
FIG. 7 is a block diagram showing a third concrete example relating to signal pin specifications of the memory system according to the first embodiment of the present invention.

In such a case, as shown in FIG. 6, it is preferable that an I/O data signal pin dedicated for directly accessing memory LSI 11, LSI 12, and LSI 13 from the exterior of the memory system is provided as a signal interface at the memory system. Or, as shown in FIG. 7, it is preferable that both of an address signal pin and an I/O data signal pin which are dedicated for directly accessing memory LSI 11, LSI 12, and LSI 13 from the exterior of the memory system are provided as signal interfaces at the memory system. Due to such a configuration with flexibility being provided, a memory system including the memory LSIs which cannot be controlled under common interface specifications can be configured.

FIG. 6 is a block diagram showing a second concrete example relating to signal pin specifications of the MCP type memory system according to the first embodiment.

An MCP type memory system 30b shown in FIG. 6 is different from that of the first concrete example described above with reference to FIG. 5 in that a ROM chip 2 is added as the memory LSI 13. Circuits as described below are further added. Same portions as those in the first concrete example shown in FIG. 5 are denoted by same reference numerals.

(1) As internal buses 31 (FIG. 3) of the package, a sub local data bus 314 for transmitting and receiving data between some specific memory LSIs (the ROM chip 2 in the present embodiment) among the plural types of memory LSIs and the exterior of the memory system is further provided. The sub local data bus 314 is connected to the local data bus 312.

(2) The some specific memory LSIs (the ROM chip 2 in the present embodiment) among the plural types of memory LSIs can be directly accessed from the exterior of the package, to read out data in this embodiment, via the interface specifications the some specific memory LSIs have, and it is possible for the some specific memory LSIs to transmit and receive data to and from the exterior of the memory system via the sub local data bus 314.

(3) A controlling LSI 15b has a function of accessing with respect to a memory LSI among the memory LSIs other than the some specific memory LSIs (the ROM chip 2 in the present embodiment) among the plural types of memory LSIs via standard interface specifications common to the memory system, and of carrying out a predetermined operation among the read, write, and erase operations.

(4) In order to make an access to the ROM chip 2 from the exterior of the memory system possible, a third data bus gate (I/O Control) 55 is inserted between the sub local data bus 314 and the dedicated I/O data signal pin (I/O ROM 2). The third data bus gate 55 is controlled to be turned on and off by control signals generated at the control circuit in the controlling LSI 15.

FIG. 7 is a block diagram showing a third concrete example relating to signal pin specifications of the MCP type memory system according to the first embodiment.

An MCP type memory system 30c shown in FIG. 7 is different from that of the first concrete example described above with reference to FIG. 5 in that a ROM chip 2 is added as part of the memory LSI 13. Circuits as described below are further added. Same portions as those in the first concrete example shown in FIG. 5 are denoted by same reference numerals.

(1) As internal buses 31 (FIG. 3) of the package, a sub local data bus 314 for transmitting and receiving data between some specific memory LSIs (the ROM chip 2 in the present embodiment) among the plural types of memory LSIs and the exterior of the memory system, and a sub local address bus 315 by which the aforementioned ROM chip 2 receives address data from the exterior of the memory system are further provided.

The aforementioned sub local data bus 314 is connected to the local data bus 312 in the interior of the memory system, and the aforementioned sub local address bus 315 is connected to the local address bus 311 within the memory system.

(2) The some specific memory LSIs (the ROM chip 2 in the present embodiment) among the plural types of memory LSIs can be directly accessed from the exterior of the package via the interface specifications which the some specific memory LSIs have, to read data. Namely, it is possible that the some specific memory LSIs (the ROM chip 2 in the present embodiment) receive address data from the exterior of the memory system via the sub local address bus 315, and transmit and receive data to and from the exterior of the memory system via the sub local data bus 314.

(3) A controlling LSI 15c has a function of accessing with respect to a memory LSI among the memory LSIs other than the some specific memory LSIs (the ROM chip 2 in the present embodiment) among the plural types of memory LSIs via standard interface specifications common to the memory system, and of carrying out a predetermined operation among the read, write, and erase operations.

(4) In order to make an access to the ROM chip 2 from the exterior of the memory system possible, a third address bus gate (Address Control) 56 is inserted between the sub local address bus 315 and the dedicated address signal pin (Address ROM 2), and a third data bus gate (I/O Control) 55 is inserted between the sub local data bus 314 and the dedicated I/O data signal pin (I/O ROM 2). The third address bus gate 56 and the third data bus gate 55 are controlled to be turned on and off by control signals generated at the control circuit in the controlling LSI 15c.

(5) In order to make an access to other memory LSIs during a period of time of accessing from the exterior of the memory system to the ROM chip 2 possible, a fourth address bus gate (Address Control) 57 for separating the sub local address bus 315 which is connected to the ROM chip 2 from the local address bus 311 connected to the other memory LSIs, and a fourth data bus gate (I/O control) 58 for separating the sub local data bus 314 which is connected to the ROM chip 2 from the local data bus 312 connected to the other memory LSIs are inserted. These fourth address bus gate 57 and fourth data bus gate 58 are controlled to be turned on and off by control signals generated at the control circuit in the controlling LSI 15c.

Fourth Embodiment

In the concrete examples shown in FIGS. 6 and 7 described above, a sub local address bus and a sub local data bus which are dedicated for only a ROM chip 2 among the plural types of memory LSIs in the memory system are provided. However, in a fourth embodiment of the present invention, an example in which a sub local address bus and a sub local data bus which are dedicated for only a ROM chip 1 are provided will be described.

Figure 8:
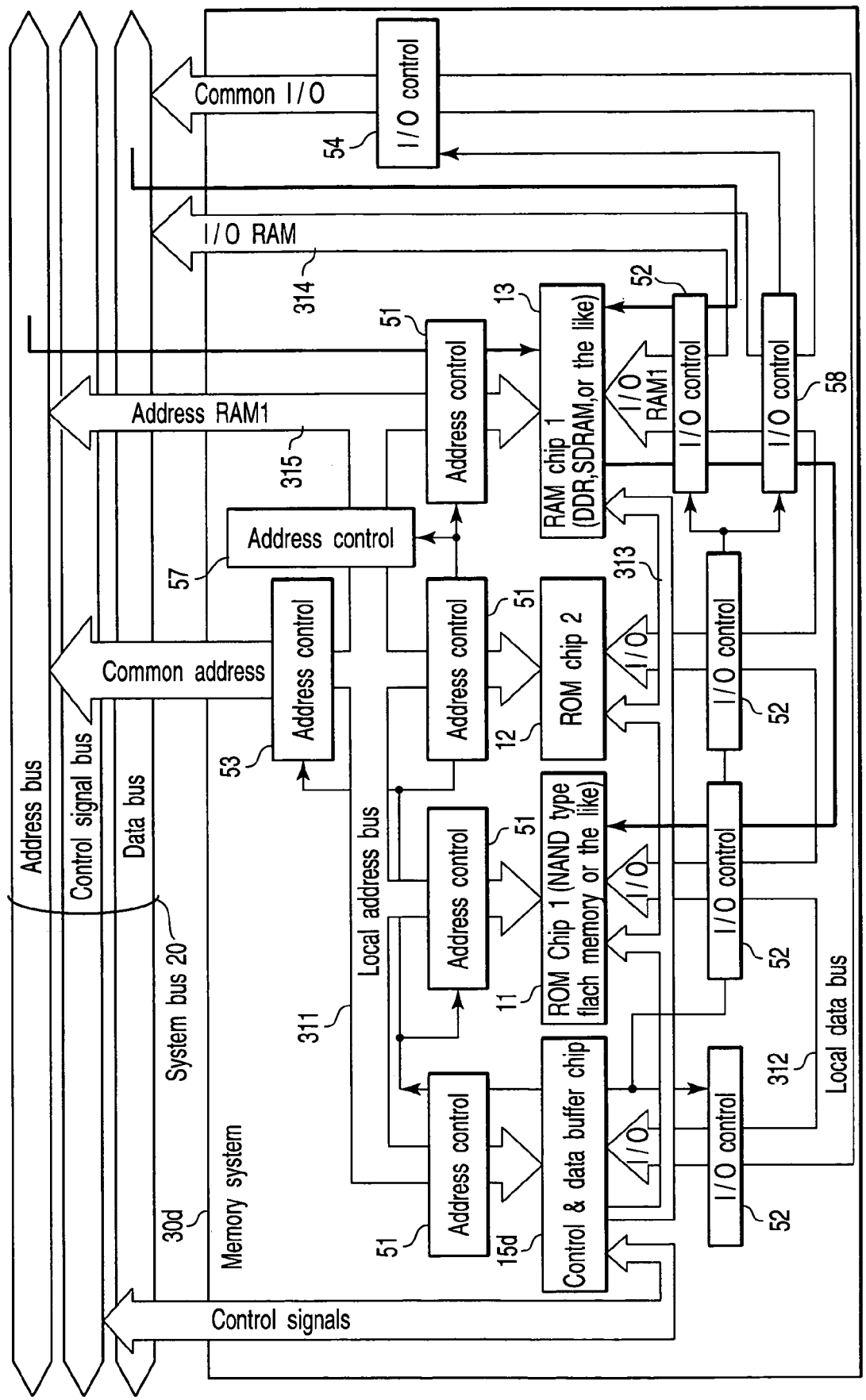
FIG. 8 is a block diagram showing a part of a computer system to which a memory system according to a fourth embodiment of the present invention is connected as a part of an external memory.

FIG. 8 is a block diagram showing a part of a computer system to which the MCP type memory system according to the fourth embodiment is connected as a part of an external memory.

An MCP type memory system 30d shown in FIG. 8 is different from that of the first concrete example described above with reference to FIG. 5 in the following points. Same portions as those in the first concrete example shown in FIG. 5 are denoted by same reference numerals.

(1) As internal buses of the package, a sub local data bus 314 for transmitting and receiving data between some specific memory LSIs (the RAM chip 1 in the present embodiment) among the plural types of memory LSIs and the exterior of the memory system, and a sub local address bus 315 by which the aforementioned RAM chip 1 receives address data from the exterior of the memory system are further provided.

The aforementioned sub local data bus 314 is connected to the local data bus 312 in the interior of the memory system, and the aforementioned sub local address bus 315 is connected to the local address bus 311 within the memory system.

(2) The some specific memory LSIs (the RAM chip 1 in the present embodiment) among the plural types of memory LSIs can be directly accessed from the exterior of the package via the interface specifications which the some specific memory LSIs have, and read and write operations can be carried out with respect to the some specific memory LSIs. Namely, it is possible that the some specific memory LSIs receive address data from the exterior of the memory system via the sub local address bus 315, and transmit and receive data to and from the exterior of the memory system via the sub local data bus 314.

(3) A controlling LSI 15d has a function of accessing with respect to a memory LSI among the memory LSIs other than the some specific memory LSIs (the RAM chip 1 in the present embodiment) among the plural types of memory LSIs via standard interface specifications common to the memory system, and of carrying out a predetermined operation among the read, write, and erase operations.

(4) In order to make an access to other memory LSIs during a period of time of accessing from the exterior of the memory system to the RAM chip 1 possible, a fourth address bus gate (Address Control) 57 for separating the local address bus 311 and the sub local address bus 315 which are connected to the RAM chip 1 from the local address bus 311 connected to the other memory LSIs, and a fourth data bus gate (I/O control) 58 for separating the local data bus 312 and the sub local data bus 314 which are connected to the RAM chip 1 from the local data bus 312 connected to the other memory LSIs are inserted. These fourth address bus gate 57 and fourth data bus gate 58 are controlled to be turned on and off by control signals generated at the control circuit in the controlling LSI 15d.

In accordance with the computer system shown in FIG. 8, for example, large capacity image data obtained by continuous photographing of still pictures, large capacity image data of moving pictures, or the like can be recorded in the MCP type memory system 30d at a high-speed data transfer rate at the same time of photographing. In this case, first, the image data is temporarily stored by being written into the RAM chip 1 at a high-speed. In this case, it is preferable that a double data rate (DDR) SDRAM which has a largest possible capacity at the present time and by which a high-speed input/output transfer rate can be realized, a DRAM and an XDR DRAM in accordance with a Direct Rambus specification, or the like is used as the RAM chip 1. Next, the image data stored in the above-described RAM chip 1 is transferred to and stored in a NAND flash memory (for example, the ROM chip 1) for recording a file in the memory system on the basis of an instruction of data transfer between memory LSIs in the memory system.

At the time of the above-described operation, during a period of time when the image data is being written in the RAM chip 1, the system bus (the address bus and the data bus) at the exterior of the memory system is occupied. However, because the system bus is not occupied in execution of the data transfer between LSIs in the memory system, a load on the system is reduced. Moreover, because a period of time when the image data is being written into the NAND flash memory in the memory system is sufficiently longer than a period of time when the image data is being written into the RAM chip 1, the effect on reduction in a load on the system is high.

In accordance with the multichip package type memory system in the above-described first to fourth embodiments, when the multichip package type memory system is used by being connected as an external memory of the computer system, a load on the system bus in execution of data transfer between memory integrated circuits in the memory system is reduced, and the CPU can carry out another job by using the system bus even in execution of data transfer between the memory integrated circuits in the memory system, so that efficiency of the entire computer system can be markedly improved.

Fifth Embodiment

Figure 9:
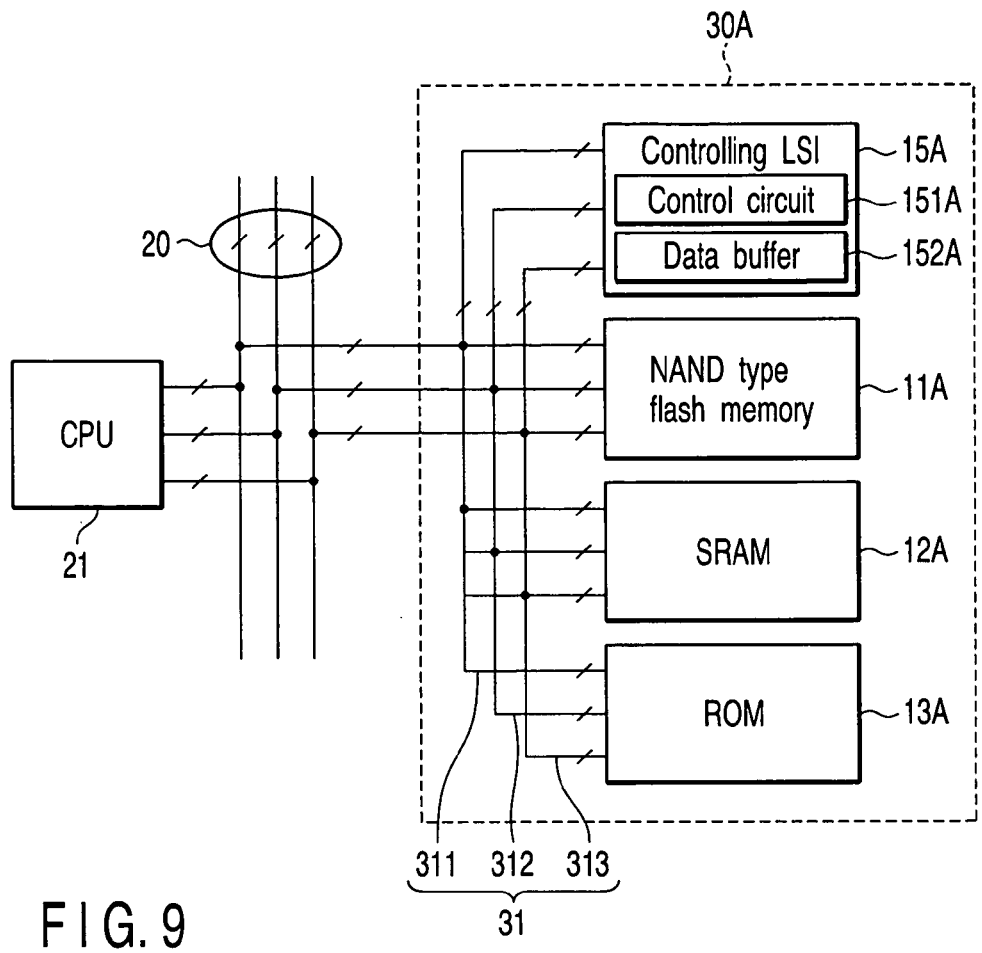
FIG. 9 is a block diagram schematically showing a state in which an MCP type memory system according to a fifth embodiment of the present invention is connected as a part of an external memory of the computer system.

FIG. 9 is a block diagram schematically showing a state in which an MCP type memory system according to a fifth embodiment of the present invention is connected as a part of an external memory of the computer system.

In FIG. 9, at a memory system 30A, plural types of memory LSIs 11A, 12A, and 13A, and a controlling LSI 15A are packaged in one package. Among the above-described plural types of memory LSIs 11A, 12A, and 13A, the memory LSI 11A is a nonvolatile memory LSI, and the memory LSI 12A is a volatile memory LSI. Namely, as the above-described plural types of memory LSIs 11A, 12A, and 13A, at least a nonvolatile memory LSI and a volatile memory LSI whose random access operation rate is higher than that of the nonvolatile memory LSI are included.

The above-described memory LSI 11A which is a nonvolatile memory LSI is a read only memory which is electrically erasable/rewritable (EEPROM). The memory LSI 11A is one of a flash memory except for a NOR type flash memory among batch-erasable flash memories, i.e., a NAND type flash memory, an AND type flash memory, and a multivalued NOR type flash memory. The memory LSI 11A stores a system starting program (including an initial setting program) needed for starting the computer system. In the present embodiment, as shown in FIG. 9, a NAND type flash memory is used as the memory LSI 11A.

Further, the memory LSI 12A, which is a volatile memory LSI, is one of the large capacity and high performance RAMs such as SRAMs and DRAMs. SRAM also includes a pseudo SRAM (Pseudo SRAM: PSRAM), and DRAM includes a synchronous dynamic memory (Synchronous DRAM; SDRAM). In the present embodiment, as shown in FIG. 9, an SRAM is used as the memory LSI 12A.

In the same package, one controlling LSI 15A is packaged along with a NAND flash memory serving as the memory LSI 11A, an SRAM serving as the memory LSI 12A, and a ROM serving as the memory LSI 13A.

In the aforementioned package, the internal bus 31 including the address bus 311 which is a local address bus, the data bus 312 which is a local data bus, and the control bus 313 which is a local control bus is provided, and the aforementioned respective LSIs 11A, 12A, 13A, and 15A are connected in common to the internal bus 31. Then, the internal bus 31 is connected to the system bus 20 of the computer system. The memory system 30A is used as an external memory of the computer system. The CPU 21, a general memory (not shown), and the like are further connected to the system bus 20.

The respective memory LSIs 11A, 12A, and 13A can be respectively accessed for the read, write, and erase operations from the exterior of the package or the controlling LSI 15A. In this case, it is possible to access via the interface specifications which the memory LSIs 11A, 12A, and 13A have.

In the controlling LSI 15A, there is built-in a control circuit unit for controlling such that, at the time of system starting, a system starting program is read out of the memory LSI (NAND type flash memory) 11A, such as a time of turning the power supply on, a time of resetting the system, and a time of booting for the computer system, and the system starting program is transferred to and written into the memory LSI (SRAM) 12A via the data bus 312. The control circuit unit has a control circuit 151A and a data buffer 152A, and the system starting program is read out of the memory LSI (NAND type flash memory) 11A and is written into the data buffer 152A via the data bus 312 by the control circuit 151A. Moreover, the control circuit unit reads the data out of the data buffer 152A, and transfers the data to the memory LSI (SRAM) 12A via the data bus 312 again.

The CPU 21 starts the control circuit 151A of the controlling LSI 15A at the time of system starting, and after the CPU 21 reads the system starting program out of the memory LSI (NAND type flash memory) 11A, and transfers and writes the system starting program to and into the memory LSI (SRAM) 12A via the data bus 312 under the control of the control circuit 151A, the CPU 21 executes the system starting program by accessing the memory LSI (SRAM) 12A.

Note that, as a trigger with respect to an operation of transferring the system starting program of the control circuit 151A, suppose that an instruction from the CPU 21 is the trigger. Or, a power-on-reset signal generated at the time of system starting is inputted to the control circuit 151A, and the power-on-reset signal may be a trigger.

Figure 10:
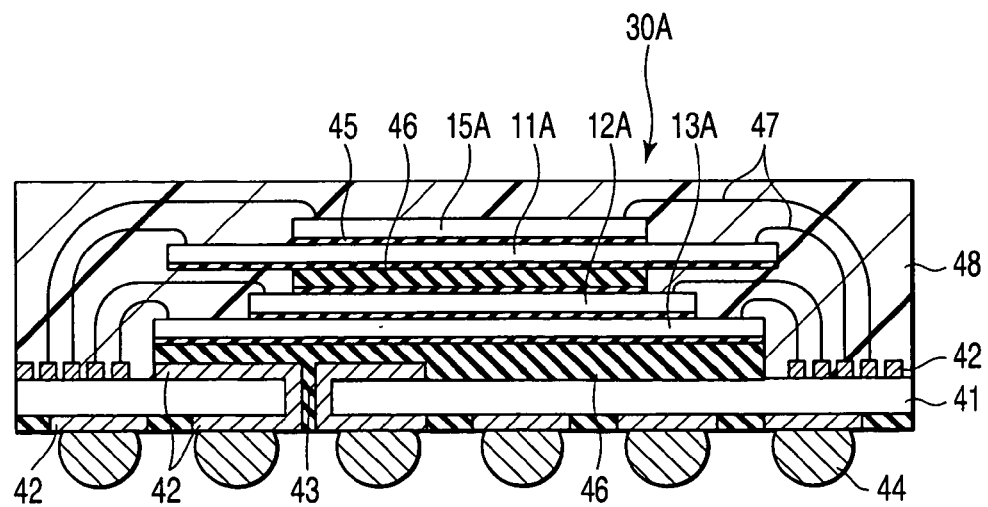
FIG. 10 is a sectional view schematically showing an MCP type memory system having a stack structure which is one packaging example of the MCP type memory system of FIG. 9.

FIG. 10 is a sectional view schematically showing one packaging example of the MCP type memory system 30A of FIG. 9.

In FIG. 10, at a packaging substrate 41, wiring patterns 42 are respectively formed on the top surface and the rear surface thereof, and some of those are connected via a through hole wiring 43. External connection terminals (for example, a ball grid array) 44 are formed on the rear surface of the packaging substrate 41. In the present embodiment, the aforementioned internal bus 31 (FIG. 9) including a local address bus 311, a local data bus 312, and a local control bus 313 is formed as a part of the wiring patterns 42. A plurality of LSI chips are stacked on the packaging substrate 41 via an adhesive 45 and a spacer 46. In the embodiment, plural types of memory LSI 11A, LSI 12A, and LSI 13A, and a controlling LSI 15A are included in the plurality of LSIs. The memory LSI 11A, LSI 12A, and LSI 13A, and the controlling LSI 15A are connected to the wiring patterns 42 on the top surface of the packaging substrate via respective pads by bonding wires 47, and are sealed with a resin 48. In accordance with the configuration, the multichip package type memory system 30A with a stack structure which is small-sized and thin as a whole (Stacked MCP) is configured.

The computer system of FIG. 9 with the configuration as above reads a system starting program stored in advance in the memory LSI (NAND type flash memory) 11A, and transfers and writes the system starting program to and into the memory LSI (SRAM) 12A under the control of the controlling LSI 15A at the time of system starting. At that time, while the system starting program is being read out of the memory LSI (NAND type flash memory) 11A, the system starting program is written into the memory LSI (SRAM) 12A while providing a write address to the memory LSI (SRAM) 12A at a cycle time corresponding to the timing specification.

In this case, it is not the control in which transfer data is fetched from a memory region at the interior of the MCP type memory system 30A onto a memory region at the exterior of the MCP type memory system 30A, and is written into a RAM at the interior of the MCP type memory system 30A again, but the operation is carried out directly within the MCP type memory system 30A, and therefore, data transfer can be achieved at an extremely high-speed. Further, because data transfer is carried out directly at the interior of the MCP type memory system 30A, regardless of the fact that the system starting program is stored in the memory LSI (NAND type flash memory) 11A which is originally slow in random access, the problem on a reduction in a speed relating to an operation in which the system starting program is read out serially and transferred to the memory LSI (SRAM) 12A is not brought about.

After the program file is stored in the memory LSI (SRAM) 12A, which is high-speed in random access at the time of system starting as described above, a program code is read out of the memory LSI (SRAM) 12A, and the program is executed. Accordingly, it is convenient because the memory LSI (SRAM) 12A can be used as a cache memory unless the system power supply is shut off, and a high-speed operation can be achieved.

As described above, in the present embodiment, the memory LSI (NAND type flash memory) 11A which is advantageous in terms of a bit cost is used, and the system starting program is stored in the memory LSI (NAND type flash memory) 11A. Therefore, there is no need to store the system starting program in a NOR type flash memory, whose bit cost is high, which has been used conventionally. Because it is sufficient even if the NOR type flash memory for storing the system starting program is not used, it is greatly effective for a reduction in the bit cost. Moreover, by packaging the chips of the plurality of memory LSIs 11A, 12A, and 13A, and the controlling LSI 15A in the MCP type memory system 30A, the packaging volume can be made small which greatly contributes to miniaturization of the entire computer system, so that it is effective as a component in a small-sized device such as a portable telephone or the like. Note that, when an AND type flash memory or a multivalued NOR type flash memory is used as the memory LSI 11A in place of a NAND type flash memory, an effect which is the same as in the case where the NAND type flash memory is used can be obtained.

Moreover, in the computer system using the MCP type memory system 30A described above, by utilizing the function of copying data from the NAND type flash memory LSI 11A to the SRAM LSI 12 at the time of system starting, it is possible to execute copying data from the NAND type flash memory to the SRAM onto an address range at the interior of the MCP type memory system 30A, at not only the time of system starting, but also the time of a general operation as well. Moreover, a function of executing an operation of data transfer between the memory LSIs in the MCP type memory system 30A may be provided to the control circuit unit of the MCP type memory system 30A.

Due to the MCP type memory system being configured as described above, an operation in which the system efficiency is markedly improved as compared with a conventional direct memory access (Direct Memory Access; DMA) is possible. Namely, in a conventional DMA operation, there is no load on the CPU. However, because data write/read between memories are carried out via the system bus 20, the system bus 20 is occupied during execution of the DMA. In contrast thereto, with respect to the DMA operation in the computer system using the MCP type memory system 30A according to the present embodiment, because the data copying operation can be executed via the internal bus 31, there is no need to use the system bus 20.

<Concrete Example relating to Signal Pin Specification of Memory System According to Fifth Embodiment>

Figure 11:
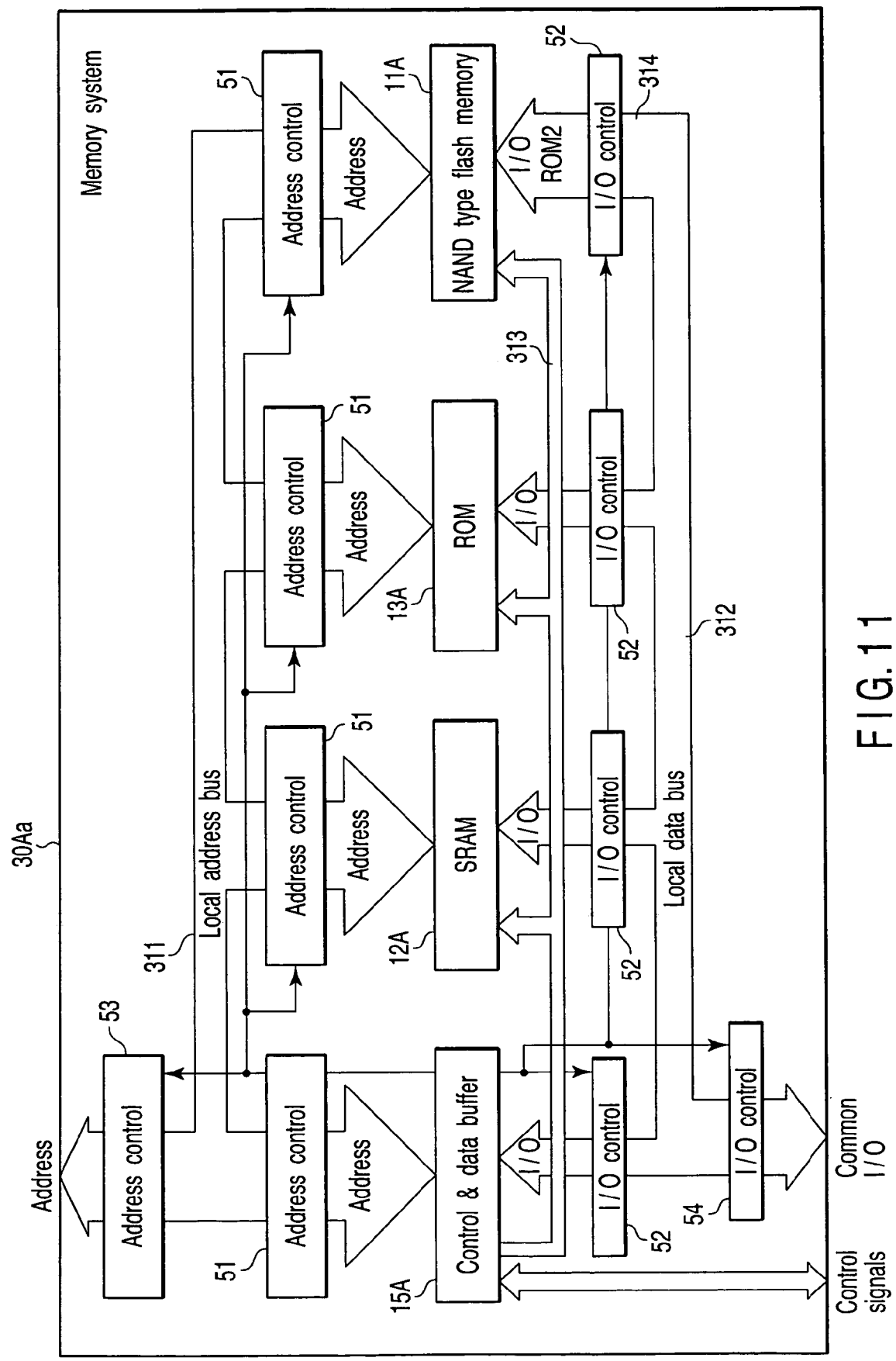
FIG. 11 is a block diagram showing one concrete example relating to signal pin specifications of the MCP type memory system according to the fifth embodiment of the present invention.

FIG. 11 is a block diagram showing a concrete example relating to signal pin specifications of an MCP type memory system according to a fifth embodiment of the present invention.

This MCP type memory system 30Aa includes the memory LSI (NAND type flash memory) 11A, the memory LSI (SRAM) 12A, and the memory LSI (ROM) 13A, and a control & data buffer is included as the controlling LSI 15A.

The memory LSI 11A, 12A and 13A and the controlling LSI 15A are connected to each other by the local address bus 311, the local data bus 312, and the local control signal bus 313. The first address bus gates (Address Control) 51 are inserted in the address bus branched paths branched off from the local address bus 311 in correspondence to the respective LSI 11A, 12A, 13A, and 15A. The second address bus gate (Address Control) 53 is inserted between the local address bus 311 and the external address bus. Further, the first data bus gates (I/O control, i.e., input/output control circuit) 52 are inserted in the data bus branched paths branched off from the local data bus 312 in correspondence to the respective LSI 11A, 12A, 13A, and 15A. In addition, the second data bus gate (I/O control) 54 is inserted between the local data bus 312 and the external data bus.

In the above-described configuration, the respective address bus gates 51 and 53 and the respective data bus gates 52 and 54 are controlled to be turned on and off by control signals generated at the control circuit in the controlling LSI 15A, whereby the control by the controlling LSI 15A as described above is possible.

Sixth Embodiment

Figure 12:
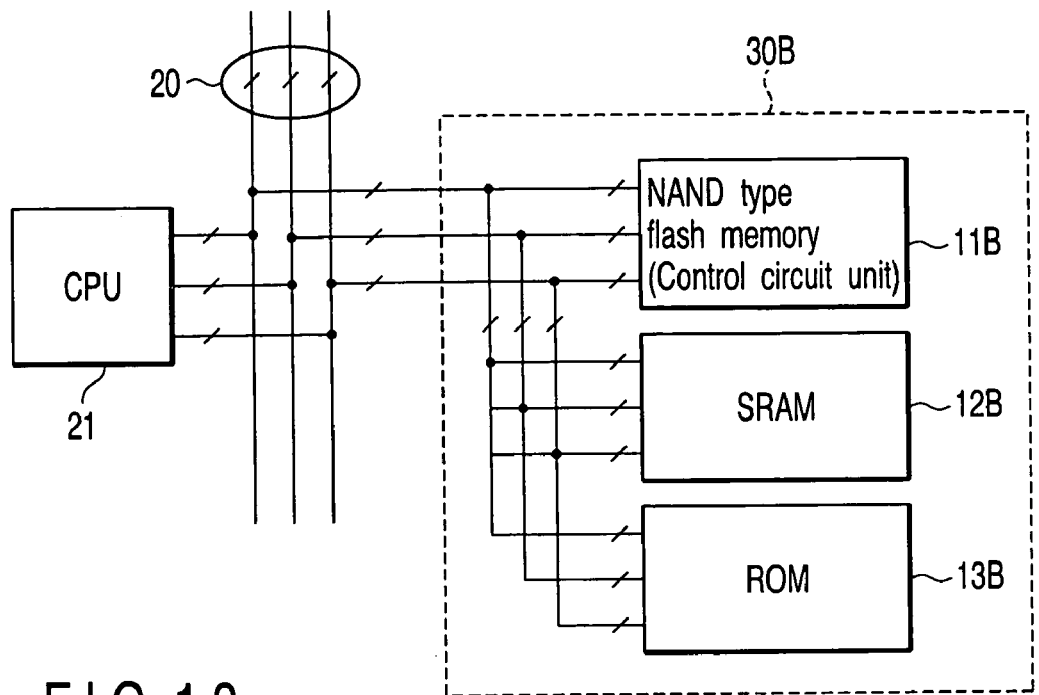
FIG. 12 is a block diagram schematically showing an MCP type memory system according to a sixth embodiment of the present invention.

FIG. 12 schematically shows an MCP type memory system 30B according to a sixth embodiment of the present invention.

In this MCP type memory system 30B, the control circuit unit is built in the memory LSI (NAND type flash memory) 11B, though the control circuit unit is built in the controlling LSI 15A in the MCP type memory system 30A according to the fifth embodiment. In this case, it may be configured such that the NAND type flash memory LSI 11B itself detects the time of turning the power supply on, and starts the control circuit unit. Note that, the control circuit unit may be built in a memory LSI (SRAM) 12B in place of being built in the memory LSI (NAND type flash memory) 11B.

Figure 13:
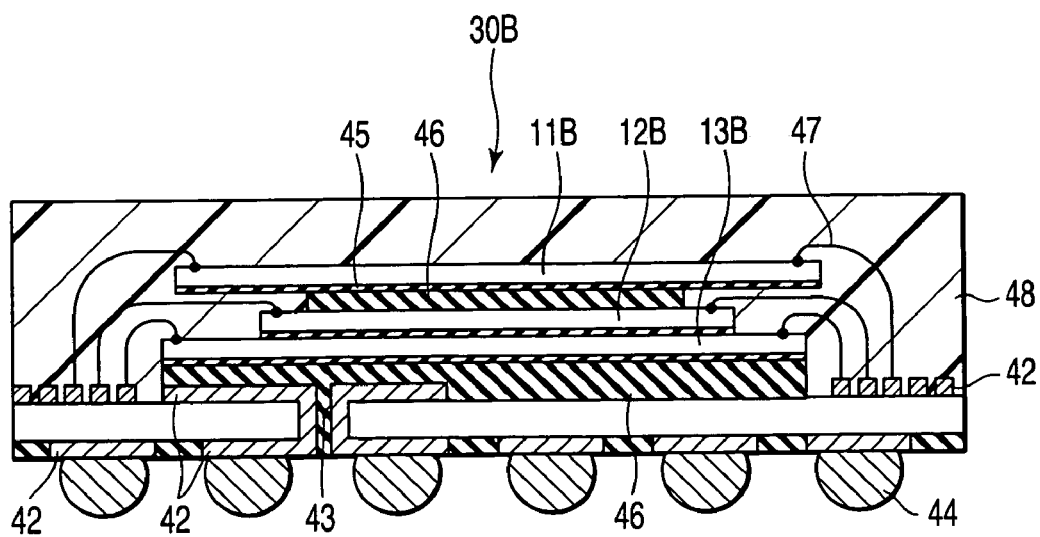
FIG. 13 is a sectional view schematically showing an MCP type memory system having a stack structure which is one packaging example of the MCP type memory system of FIG. 12.

FIG. 13 is a sectional view schematically showing an MCP type memory system having a stack structure which is one packaging example of the MCP type memory system 30B of FIG. 12.

This MCP type memory system 30B is different from the MCP type memory system 30A according to the fifth embodiment described above with respect to FIG. 10 in that the controlling LSI 15A is not provided, and the LSIs 11A, 12A, and 13A are changed to the LSIs 11B, 12B, and 13B. Same portions as those in the MCP type memory system 30A according to the fifth embodiment shown in FIG. 10 are denoted by same reference numerals, and descriptions thereof are omitted.

Seventh Embodiment

In the fifth embodiment described above with reference to FIG. 9, the example has been described in which access operations are carried out via the particular interface specifications (the I/O data signal pin, the address signal pin, and the control signal pin and the control method) which the respective memory LSIs 11A, 12A, and 13A in the MCP type memory system 30A have.

However, in a case where the I/O interface specification of the memory LSI (NAND type flash memory) 11A and the I/O interface specification of the memory LSI (SRAM) 12A are different from each other, it may be difficult that the memory LSI (NAND type flash memory) 11A and the memory LSI (SRAM) 12A are connected via the internal bus 31, and data is directly written into the memory LSI (SRAM) 12A, while data is read from the memory LSI (NAND type flash memory) 11A by controlling the respective control signal pins of the memory LSIs.

Further, in the computer system, rather than a case of accessing to the respective memory LSIs 11A, 12A, and 13A via the interface specifications which the respective memory LSIs 11A, 12A, and 13A in the MCP type memory system 30A have, if it is possible to access to the respective memory LSIs 11A, 12A, and 13A via the common I/O data signal pin, address signal pin, and control signal pin which the MCP type memory system 30A has, it is easier to construct the system. In this case, necessarily, the controlling LSI 15 in the MCP type memory system 30A needs a control function of converting an instruction received from the exterior of the memory system into the interface specifications which the respective memory LSIs 11A, 12A, and 13A in the MCP type memory system 30A have, and of accessing thereto, in accordance with the types of the respective memory LSIs 11A, 12A, and 13A.

The MCP type memory system according to the seventh embodiment has a configuration which is basically the same as that of the MCP type memory system 30A shown in FIG. 9. However, the controlling LSI 15A has a function of accessing a memory LSI among the plural types of memory LSIs 11A, 12A, and 13A via standard interface specifications common to the MCP type memory system, and of carrying out a predetermined operation among the read, write, and erase operations. Namely, the control circuit unit of the controlling LSI 15A carries out access control in which the memory LSIs 11A, 12A, and 13A are respectively accessed via the standard interface specifications common to the MCP type memory system, and a predetermined operation among the read, write, and erase operations is carried out (in other words, a function of absorbing a difference between the I/O interfaces of the respective memory LSIs 11A, 12A, and 13A), in addition to transfer control in which a program file is transferred from the LSI (NAND type flash memory) 11A to the memory LSI (SRAM) 12A at the time of system starting as described above.

In accordance with the control circuit unit of the controlling LSI 15A as described above, data transfer between memory LSIs can be executed within the memory system via the interface specifications common to the memory system including a timing specification or the like. Namely, when the controlling LSI 15A receives, for example, an instruction of data transfer in the memory system and a required designation from the exterior of the package, data at the continuous addresses from a start address up to an end address of a first random read memory LSI among the plural types of memory LSIs 11A, 12A, and 13A can be read out, and the read data can be written into the memory cells at the continuous addresses from a start address up to an end address of a second random write memory LSI. In other words, in addition to the instruction of data transfer between memory LSIs in the memory system, a transfer origin memory, a read start address of the transfer origin memory, a read end address of the transfer origin memory, a transfer destination memory, a write start address of the transfer destination memory, and a write end address of the transfer destination memory are designated, whereby an operation of data transfer between memory LSIs in the memory system is executed regardless of what types a readable transfer origin memory and a writable transfer destination memory are.

Note that the above-described control circuit may be built in the memory LSI (SRAM) 12A or the LSI (NAND type flash memory) 11A in place of being built in the controlling LSI 15A.

<Concrete Example Relating to Signal Pin Specification According to Eighth Embodiment>

Under the present circumstances, since the interface specifications of various memory LSIs are not unified, and particular specifications respectively apply to the various memory LSIs, the case where it is impossible or difficult to carry out signal input/output via the standard I/O data signal pin and address signal pin common to all the memory LSIs in the MCP type memory system is possible.

Figure 14:
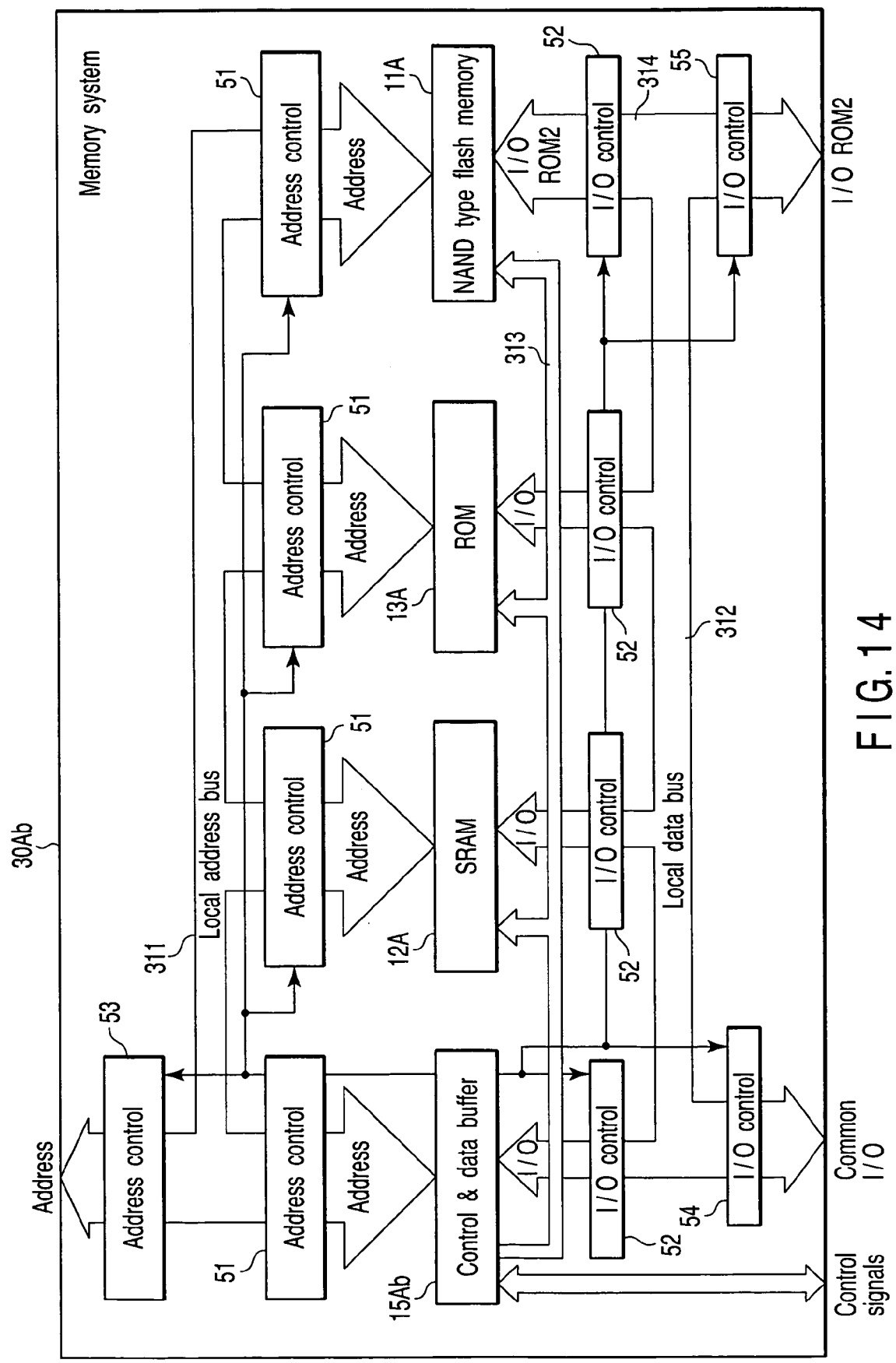
FIG. 14 is a block diagram showing one concrete example relating to signal pin specifications of an MCP type memory system according to an eighth embodiment of the present invention.
Figure 15:
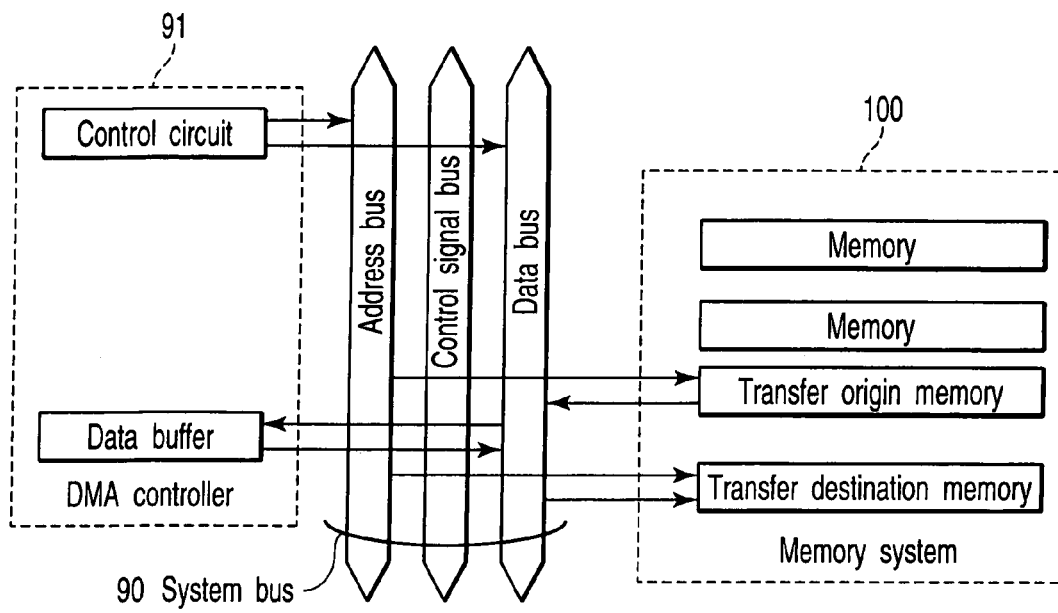
FIG. 15 is a block diagram showing a configuration example of a computer system in a case of carrying out data transfer between two memory LSIs by using a DMA mode in a conventional computer system.
Figure 16:
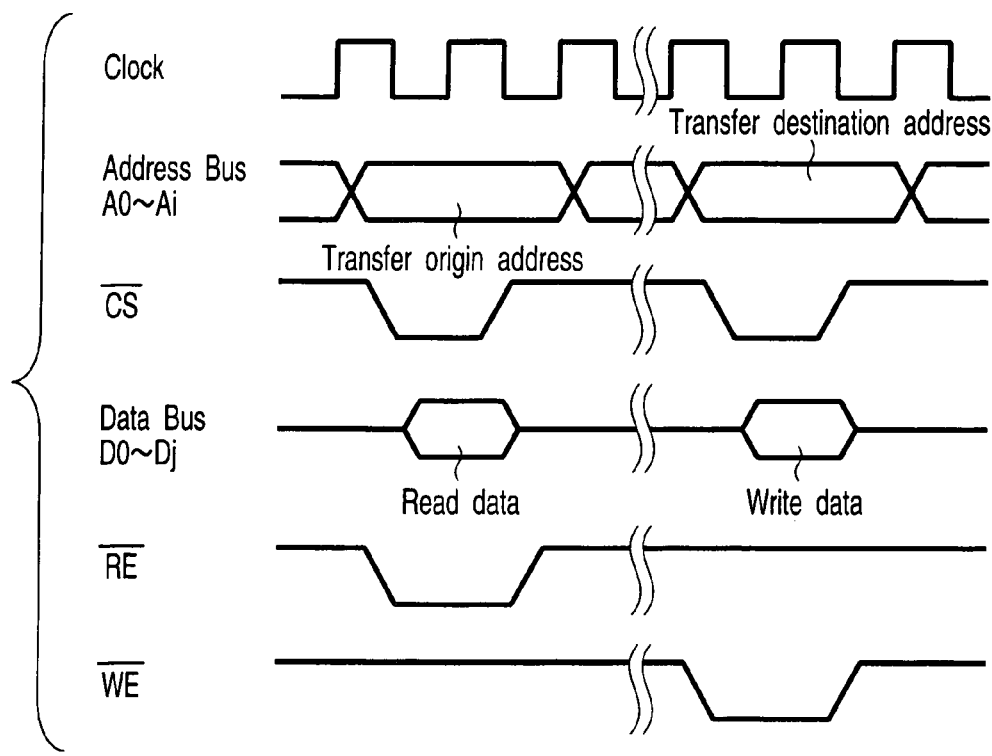
FIG. 16 is a timing chart showing an operational example in which data transfer is carried out between two memory LSIs by using a DMA mode in the computer system of FIG. 15.
Figure 17:
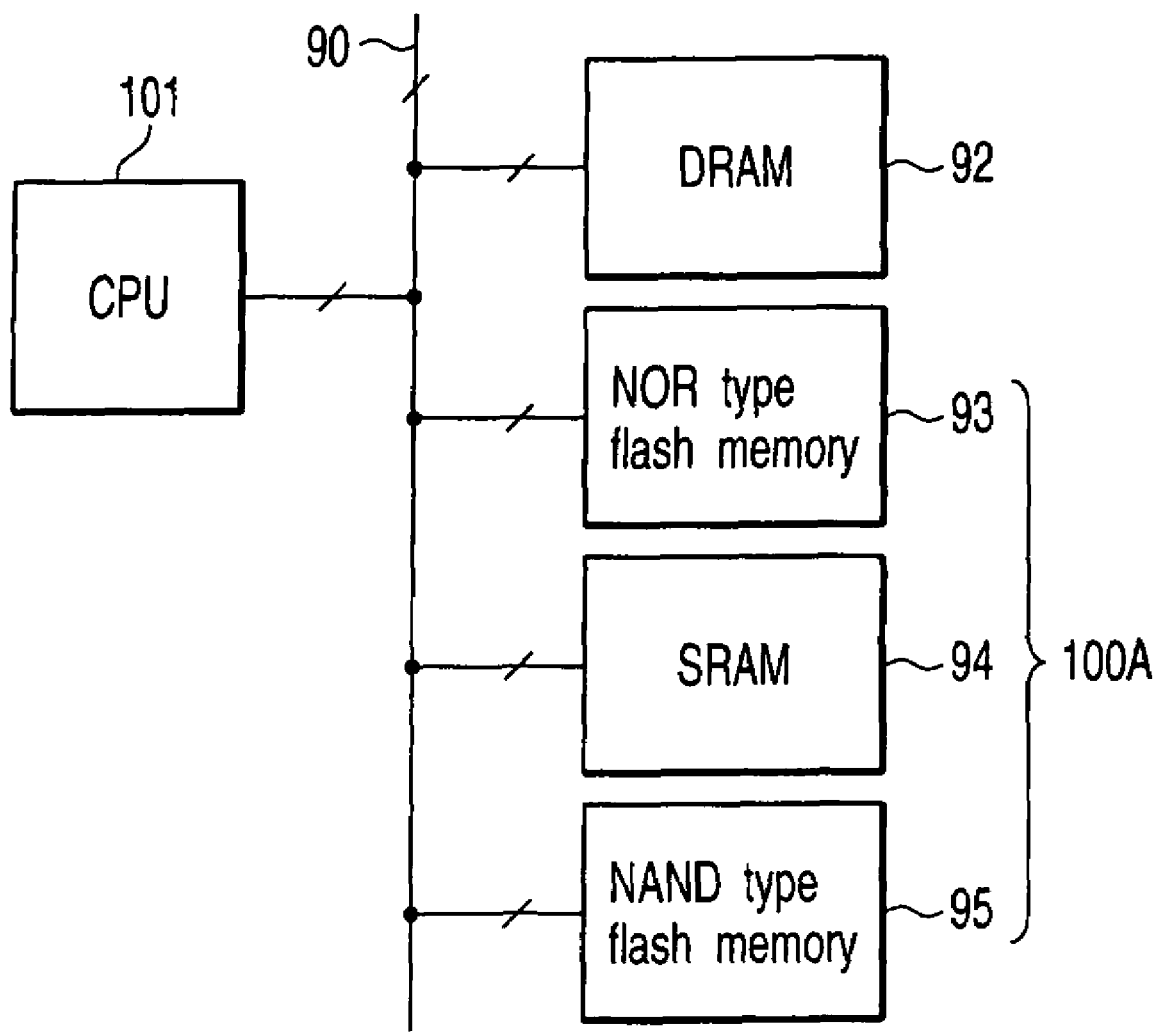
FIG. 17 is a block diagram showing one configuration example of another conventional computer system.

In such a case, for example, as shown in FIG. 14, it is preferable that an I/O data signal pin dedicated to directly accessing a certain specific memory LSI, for example, the memory LSI (NAND type flash memory) 11A from the exterior of the memory system is provided as a signal interface. Due to such a configuration with flexibility being provided, an MCP type memory system including even the memory LSIs which cannot be controlled under the common interface specification can be configured.

FIG. 14 is a block diagram showing a concrete example relating to signal pin specifications of an MCP type memory system 30Ab according to an eighth embodiment of the present invention.

The MCP type memory system 30Ab shown in FIG. 14 is different from the concrete example relating to the signal pin specification of the MCP type memory system 30Aa according to the fifth embodiment shown in FIG. 11 in the following points.

(1) As the internal bus 31 of the package, a sub local data bus 314 for transmitting and receiving data between the memory LSI (NAND type flash memory) 11A and the exterior of the memory system is added, and is connected to the local data bus 312.

(2) The memory LSI (NAND type flash memory) 11A can carry out an access operation (read in the present embodiment) directly from the exterior of the package via the interface which the memory LSI (NAND type flash memory) 11A has, and can transmit and receive data to and from the exterior of the memory system via the aforementioned sub local data bus 314.

(3) In order to make an access to the memory LSI (NAND type flash memory) 11A from the exterior of the memory system possible, a third data bus gate (I/O control) 55 is inserted between the local data bus 312 and the sub local data bus 314. The third data bus gate 55 is controlled to be turned on and off by control signals generated at the control circuit in a controlling LSI 15Ab.

(4) The controlling LSI 15Ab has a function of carrying out a predetermined access operation with respect to the memory LSIs 12A and 13A other than the memory LSI (NAND type flash memory) 11A via the standard interface specifications common to the memory system.

Ninth Embodiment

The present standard NAND type flash memory inputs and outputs address information, write data information, and read data information in a time-sharing manner by using eight I/O pins as an external interface. Moreover, because parity bit information is usually included in the read data of the NAND type flash memory, the output data outputted to the exterior of the memory system cannot be used as is, and the correct data cannot be obtained unless error checking and correcting (ECC) processing is applied to the output data. Thus, in a general NAND type flash memory system, a NAND type flash memory is connected to a processor having the ECC processing procedure. Or, a NAND type flash memory is built in the system via an input/output control LSI having a function of carrying out ECC processing with respect to the outputs from the NAND type flash memory.

In an MCP type memory system according to a ninth embodiment of the present invention, in addition to a function of transferring a program file from the NAND type flash memory to the RAM at the time of system starting as described above, a function of carrying out ECC processing with respect to the output data from the NAND type flash memory is provided to the control circuit unit of the MCP type memory system 30A according to the fifth embodiment with reference to FIG. 9. Note that the above-described control circuit unit may be built in the SRAM or the NAND type flash memory.

In the computer system using such an MCP type memory system as an external memory, in the same way as the MCP type memory system 30A according to the fifth embodiment, a program file can be transferred from the NAND type flash memory to the RAM at the time of system starting, and moreover, ECC processing can be carried out with respect to the output data from the NAND type flash memory.

Tenth Embodiment

As a recent NAND type flash memory, a NAND type flash memory having a boot block reading function has been proposed. This NAND type flash memory automatically reads out data in a specific block called a boot block in the NAND type flash memory at the time of turning the power supply on, while maintaining interchangeability due to an interface which is the same as that of the standard NAND type flash memory being maintained. ECC processing is completed in the NAND type flash memory with respect to the read data of the boot block. Moreover, it is possible to sequentially output the data in the boot block from the eight I/O lines by merely toggle-operating (repeatedly applying High/Low to) control signals (Ready Enable).

In an MCP type memory system according to a tenth embodiment of the present invention, with respect to the MCP type memory system 30A according to the fifth embodiment with reference to FIG. 9, (1) as the memory LSI (NAND type flash memory) 11A, a NAND type flash memory having a boot block reading function described above is used, and a system starting program is stored in the boot block, and (2) the control circuit unit is changed so as to have a function of reading the system starting program out of the boot block in the memory LSI (NAND type flash memory) 11A, and of transferring and writing the system starting program to and into the memory LSI (SRAM) 12A via the internal bus 31 at the time of system starting.

In the computer system using such an MCP type memory system as an external memory, in the same way as the MCP type memory system 30A according to the fifth embodiment, a program file can be transferred from the memory LSI (NAND type flash memory) 11A to the memory LSI (SRAM) 12A at the time of system starting.

In the MCP type memory systems in the above-described fifth to tenth embodiments, the system starting program is stored in the NAND type flash memory in advance, and the system starting program is transferred from the above-described flash memory to the RAM. However, the system starting program may be stored in an AND type flash memory or a multivalued NOR type flash memory in place of being stored in the NAND type flash memory. Further, a NOR type flash memory can be packaged in the same MCP as needed.

What is claimed is:

1. A multichip package type memory system comprising:
a plurality of types of memory integrated circuits each having memory cells, which are provided in a memory system packaged in a package having an internal bus including a local data bus, a local address bus, and a local control bus, and are connected to the internal bus in common, and which are accessed for a predetermined operation among read, write, and erase operations from exterior of the package, and/or, which are accessed for a predetermined operation among read, write, and erase operations within the package; and
a controlling integrated circuit which is provided in the memory system packaged in the package, and when an instruction of data transfer within the memory system is received from exterior of the package, controls an execution of the data transfer to be executed within the memory system such that data of memory cells at continuous addresses of a first readable memory integrated circuit among the plurality of types of memory integrated circuits from a start address up to an end address of the first readable memory integrated circuit are read out, and the readout data are written into memory cells at continuous addresses of a second writable memory integrated circuit among the plurality of types of memory integrated circuits from a start address up to an end address of the second writable memory integrated circuit.

2. A multichip package type memory system according to claim 1, wherein
the package further comprises a sub local data bus connected to the local data bus within the memory system to transfer data between an arbitrary memory integrated circuit among the plurality of types of memory integrated circuits and exterior of the memory system,
the arbitrary memory integrated circuit among the memory integrated circuits is directly accessed from exterior of the package via an interface specification which the arbitrary memory integrated circuit has, so that a predetermined operation among read, write, and erase operations is carried out, and the arbitrary memory integrated circuit carries out data transfer between the arbitrary memory integrated circuit and exterior of the memory system via the sub local data bus, and
the controlling integrated circuit accesses an arbitrary memory integrated circuit among the memory integrated circuits other than said arbitrary memory integrated circuit, via standard interface specifications common to the memory system, to carry out a predetermined operation among read, write, and erase operations.

3. A multichip package type memory system according to claim 1, wherein
the package further comprises a sub local data bus connected to the local data bus within the memory system to transfer data between an arbitrary memory integrated circuit among the plurality of types of memory integrated circuits and exterior of the memory system,
the package further comprises a sub local address bus connected to the local address bus within the memory system to receive address data from exterior of the memory system to be inputted to the arbitrary memory integrated circuit,
the arbitrary memory integrated circuit among the memory integrated circuits is directly accessed from exterior of the package via an interface specification which the arbitrary memory integrated circuit has, so that a predetermined operation among read, write, and erase operations is carried out, and the arbitrary memory integrated circuit carries out data transfer between the arbitrary memory integrated circuit and exterior of the memory system via the sub local data bus when the arbitrary memory integrated circuit receives the address data from exterior of the memory system via the sub local address bus, and the controlling integrated circuit accesses an arbitrary memory integrated circuit among the memory integrated circuits other than said arbitrary memory integrated circuit, via standard interface specifications common to the memory system, to carry out a predetermined operation among read, write, and erase operations.

4. A multichip package type memory system according to claim 1, wherein the controlling integrated circuit controls the execution of the data transfer to be executed between the memory integrated circuits within the memory system via standard specifications common to the memory system on the basis of designation by the instruction of data transfer with regard to a transfer origin memory, a read start address of the transfer origin memory, a read end address of the transfer origin memory, a transfer destination memory, a write start address of the transfer destination memory, and a write end address of the transfer destination memory.

5. A multichip package type memory system according to claim 4, wherein
the package further comprises a sub local data bus connected to the local data bus within the memory system to transfer data between an arbitrary memory integrated circuit among the plurality of types of memory integrated circuits and exterior of the memory system,
the arbitrary memory integrated circuit among the memory integrated circuits is directly accessed from exterior of the package via an interface specification which the arbitrary memory integrated circuit has, so that a predetermined operation among read, write, and erase operations is carried out, and the arbitrary memory integrated circuit carries out data transfer between the arbitrary memory integrated circuit and exterior of the memory system via the sub local data bus, and
the controlling integrated circuit accesses an arbitrary memory integrated circuit among the memory integrated circuits other than said arbitrary memory integrated circuit, via standard interface specifications common to the memory system, to carry out a predetermined operation among read, write, and erase operations.

6. A multichip package type memory system according to claim 4, wherein
the package further comprises a sub local data bus connected to the local data bus within the memory system to transfer data between an arbitrary memory integrated circuit among the plurality of types of memory integrated circuits and exterior of the memory system,
the package further comprises a sub local address bus connected to the local address bus within the memory system to receive address data from exterior of the memory system to be inputted to the arbitrary memory integrated circuit,
the arbitrary memory integrated circuit among the memory integrated circuits is directly accessed from exterior of the package via an interface specification which the arbitrary memory integrated circuit has, so that a predetermined operation among read, write, and erase operations is carried out, and the arbitrary memory integrated circuit carries out data transfer between the arbitrary memory integrated circuit and exterior of the memory system via the sub local data bus when the arbitrary memory integrated circuit receives the address data from exterior of the memory system via the sub local address bus, and the controlling integrated circuit accesses an arbitrary memory integrated circuit among the memory integrated circuits other than said arbitrary memory integrated circuit, via standard interface specifications common to the memory system, to carry out a predetermined operation among read, write, and erase operations.

7. A multichip package type memory system according to claim 1, wherein a control circuit of the controlling integrated circuit has an input/output control function dedicated for a NAND type flash memory which corrects an error of the NAND type flash memory.

8. A computer system comprising:
a multichip package type memory system which comprises a plurality of types of memory integrated circuits each having memory cells, which are provided in a memory system packaged in a package having an internal bus including a local data bus, a local address bus, and a local control bus, and are connected to the internal bus in common, and which are accessed for a predetermined operation among read, write, and erase operations from exterior of the package, and/or, which are accessed for a predetermined operation among read, write, and erase operations within the package; and a controlling integrated circuit which is provided in the memory system packaged in the package, and when an instruction of data transfer within the memory system is received from exterior of the package, controls an execution of the data transfer to be executed within the memory system such that data of memory cells at continuous addresses of a first readable memory integrated circuit among the plurality of types of memory integrated circuits from a start address up to an end address of the first readable memory integrated circuit are read out, and the readout data are written into memory cells at continuous addresses of a second writable memory integrated circuit among the plurality of types of memory integrated circuits from a start address up to an end address of the second writable memory integrated circuit;
a system bus connected to the multichip package type memory system; and
a central processing unit configured to provide the instruction of data transfer within the memory system to the controlling integrated circuit of the multichip package type memory system via the system bus.

9. A multichip package type memory system comprising:
a nonvolatile memory integrated circuit and a volatile memory integrated circuit which are packaged in a package, the nonvolatile memory integrated circuit including an electrically erasable/rewritable flash memory other than a NOR type flash memory and configured to store a system starting program, and the volatile memory integrated circuit having a random access operation speed higher than the nonvolatile memory integrated circuit;
an internal bus which is formed in the package, and which includes an address bus and a data bus connected to the nonvolatile memory integrated circuit and the volatile memory integrated circuit in common; and
a control circuit unit which controls a data transfer such that the system starting program is read out of the nonvolatile memory integrated circuit at the time of system starting and the readout data is transferred to and written in the volatile memory integrated circuit via the data bus, wherein, when an instruction of data transfer within the memory system is received from exterior of the package, the control circuit unit controls an execution of the data transfer to be executed within the memory system such that data of memory cells at continuous addresses of the nonvolatile memory integrated circuit from a start address up to an end address of the nonvolatile memory integrated circuit are read out, and the readout data are written into memory cells at continuous addresses of the volatile memory integrated circuit from a start address up to an end address of the volatile memory integrated circuit.

10. A multichip package type memory system according to claim 9, wherein the control circuit unit comprises a control circuit and a data buffer, and the control circuit controls the data transfer such that the system starting program is read out of the nonvolatile memory integrated circuit at the time of system starting, and the readout data is written in the volatile memory integrated circuit via the data buffer.

11. A multichip package type memory system according to claim 9, wherein the control circuit unit is built in the nonvolatile memory integrated circuit or the volatile memory integrated circuit.

12. A multichip package type memory system according to claim 9, wherein the control circuit unit is built in an integrated circuit that is other than the nonvolatile memory integrated circuit and the volatile memory integrated circuit, and the control circuit unit is packaged in the package and connected to the internal bus.

* * * * *